(12) United States Patent
Tung et al.

(10) Patent No.: US 11,322,396 B2
(45) Date of Patent: May 3, 2022

(54) ETCH STOP LAYER FOR SEMICONDUCTOR DEVICES

(71) Applicant: Taiwan Semiconductor Manufacturing Co., Ltd., Hsin-Chu (TW)

(72) Inventors: Szu-Ping Tung, Taipei (TW); Jen Hung Wang, Hsin-Chu (TW); Shing-Chyang Pan, Hsinchu County (TW)

(73) Assignee: TAIWAN SEMICONDUCTOR MANUFACTURING CO., LTD., Hsin-Chu (TW)

( * ) Notice: Subject to any disclaimer, the term of this patent is extended or adjusted under 35 U.S.C. 154(b) by 115 days.

(21) Appl. No.: 16/043,343

(22) Filed: Jul. 24, 2018

(65) Prior Publication Data

US 2018/0350666 A1 Dec. 6, 2018

Related U.S. Application Data

(62) Division of application No. 15/197,294, filed on Jun. 29, 2016, now Pat. No. 10,685,873.

(51) Int. Cl.
*H01L 23/48* (2006.01)
*H01L 23/52* (2006.01)
(Continued)

(52) U.S. Cl.
CPC .... *H01L 21/76829* (2013.01); *H01L 21/7682* (2013.01); *H01L 21/76802* (2013.01);
(Continued)

(58) Field of Classification Search
CPC .......... H01L 21/76802; H01L 21/7682; H01L 21/76832; H01L 21/76834; H01L 21/76843; H01L 21/76877; H01L 23/5222; H01L 23/5226; H01L 23/53238; H01L 23/5329; H01L 23/53295; H01L 21/76841; H01L 23/53223; H01L 23/53266;
(Continued)

(56) References Cited

U.S. PATENT DOCUMENTS 7,667,271 B2 2/2010 Yu et al.
7,910,453 B2 3/2011 Xu et al.
(Continued)

FOREIGN PATENT DOCUMENTS

DE 2013-107-635 A1 9/2014
EP 1014440 6/2000
(Continued)

*Primary Examiner* — Kimberly N Rizkallah
*Assistant Examiner* — Dilinh P Nguyen
(74) *Attorney, Agent, or Firm* — Haynes and Boone, LLP

(57) ABSTRACT

A semiconductor device includes a substrate, a first conductive feature over a portion of the substrate, and an etch stop layer over the substrate and the first conductive feature. The etch stop layer includes a silicon-containing dielectric (SCD) layer and a metal-containing dielectric (MCD) layer over the SCD layer. The semiconductor device further includes a dielectric layer over the etch stop layer, and a second conductive feature in the dielectric layer. The second conductive feature penetrates the etch stop layer and electrically connects to the first conductive feature.

20 Claims, 27 Drawing Sheets

(51) Int. Cl.
*H01L 21/4763* (2006.01)
*H01L 21/768* (2006.01)
*H01L 23/532* (2006.01)
*H01L 23/522* (2006.01)
*H01L 23/485* (2006.01)

(52) U.S. Cl.
CPC .. *H01L 21/76832* (2013.01); *H01L 21/76834* (2013.01); *H01L 21/76843* (2013.01); *H01L 21/76877* (2013.01); *H01L 23/5222* (2013.01); *H01L 23/5226* (2013.01); *H01L 23/5329* (2013.01); *H01L 23/53238* (2013.01); *H01L 23/53295* (2013.01); *H01L 21/76807* (2013.01); *H01L 23/485* (2013.01); *H01L 23/53209* (2013.01); *H01L 23/53223* (2013.01); *H01L 23/53266* (2013.01)

(58) Field of Classification Search
CPC . H01L 28/75; H01L 29/4933; H01L 29/4941; H01L 33/0037; H01L 41/0815; H01L 23/49838
USPC .................. 438/627, 643, 653; 257/751, 774
See application file for complete search history.

(56) References Cited

U.S. PATENT DOCUMENTS

| | | | |
|---|---|---|---|
| 8,377,779 B1 | 2/2013 | Wang | |
| 8,399,931 B2 | 3/2013 | Liaw et al. | |
| 8,652,894 B2 | 2/2014 | Lin et al. | |
| 8,685,516 B2 | 4/2014 | Chen et al. | |
| 8,716,765 B2 | 5/2014 | Wu et al. | |
| 8,723,272 B2 | 5/2014 | Liu et al. | |
| 8,729,627 B2 | 5/2014 | Cheng et al. | |
| 8,735,993 B2 | 5/2014 | Lo et al. | |
| 8,736,056 B2 | 5/2014 | Lee et al. | |
| 8,772,109 B2 | 7/2014 | Colinge | |
| 8,785,285 B2 | 7/2014 | Tsai et al. | |
| 8,816,444 B2 | 8/2014 | Wann et al. | |
| 8,823,065 B2 | 9/2014 | Wang et al. | |
| 8,860,148 B2 | 10/2014 | Hu et al. | |
| 9,064,894 B2* | 6/2015 | Zhang | H01L 29/7843 |
| 9,105,490 B2 | 8/2015 | Wang et al. | |
| 9,153,500 B2 | 10/2015 | Sun et al. | |
| 2007/0099414 A1 | 5/2007 | Frohberg et al. | |
| 2008/0150145 A1 | 6/2008 | King et al. | |
| 2012/0104505 A1* | 5/2012 | Henson | H01L 21/31111 257/369 |
| 2013/0032775 A1* | 2/2013 | Satoh | H01L 45/04 257/1 |
| 2014/0001574 A1 | 1/2014 | Chen et al. | |
| 2014/0027816 A1* | 1/2014 | Cea | H01L 29/66545 257/192 |
| 2014/0110755 A1 | 4/2014 | Colinge | |
| 2014/0151812 A1 | 6/2014 | Liaw | |
| 2015/0228763 A1* | 8/2015 | Lin | H01L 21/31055 257/401 |
| 2016/0093566 A1 | 3/2016 | Ting et al. | |
| 2016/0141294 A1* | 5/2016 | Peri | H01L 21/28568 257/324 |
| 2016/0343660 A1* | 11/2016 | Kim | H01L 23/5226 |
| 2018/0005876 A1 | 1/2018 | Tung et al. | |

FOREIGN PATENT DOCUMENTS

| | | |
|---|---|---|
| KR | 20150094498 | 8/2015 |
| KR | 20160028935 | 3/2016 |
| KR | 20160036453 | 4/2016 |
| TW | 200411765 | 7/2004 |
| TW | 200416948 | 9/2004 |
| TW | 201616568 | 5/2016 |
| TW | 201719809 | 6/2017 |

* cited by examiner

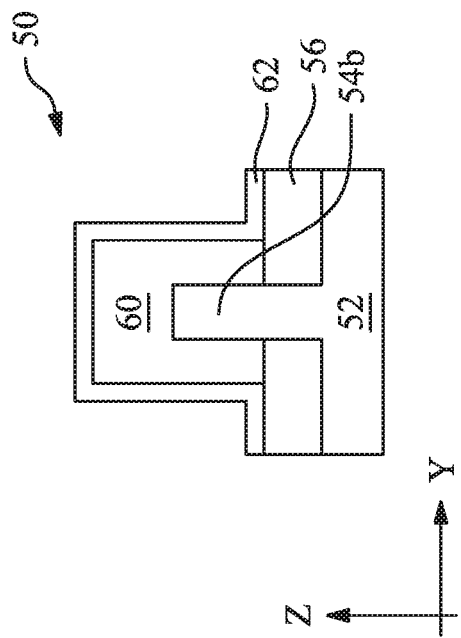
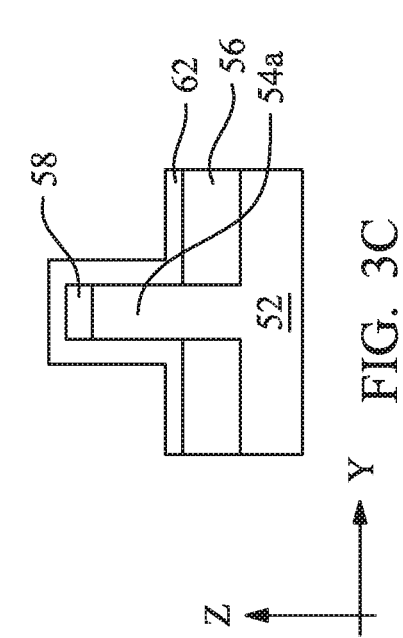
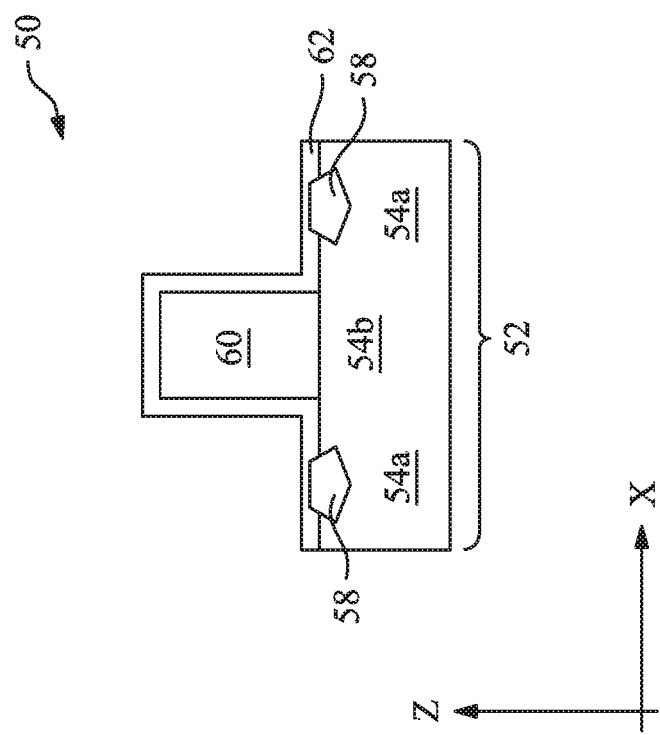
FIG. 3B
FIG. 3C
FIG. 3A

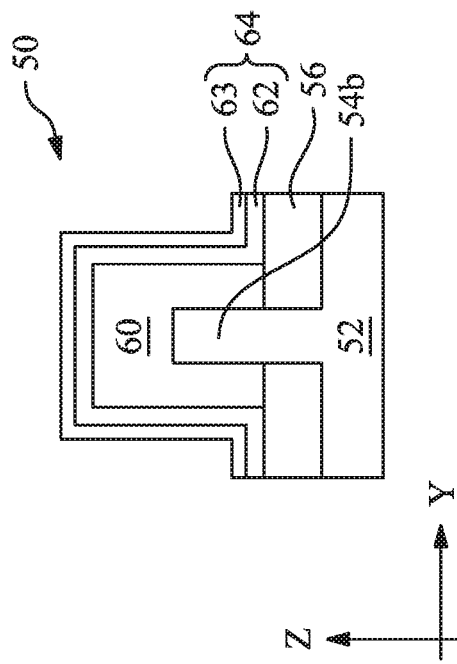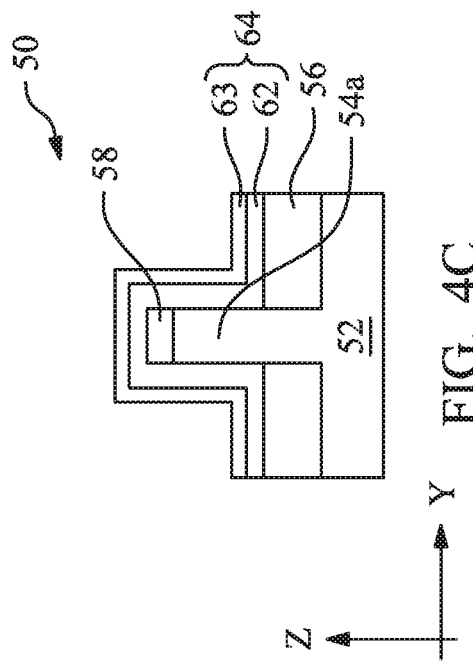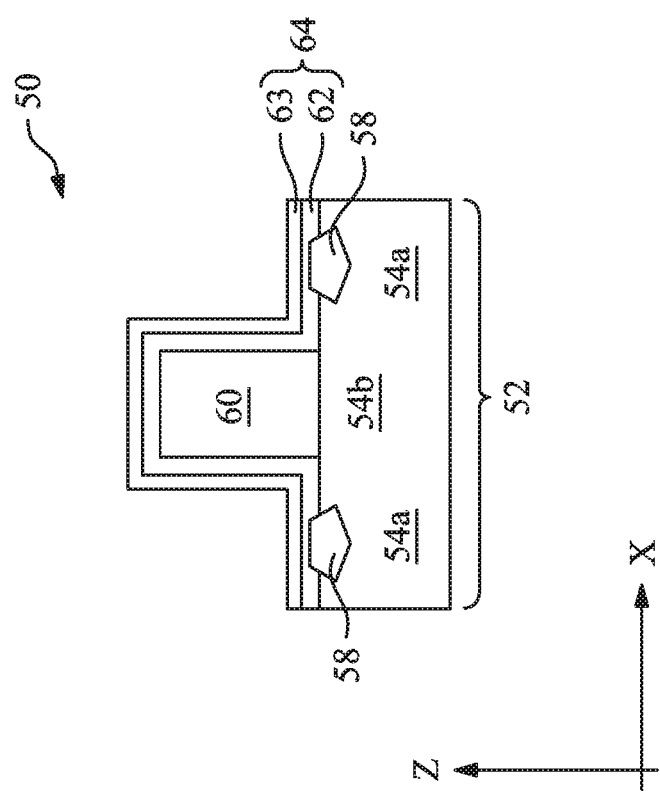

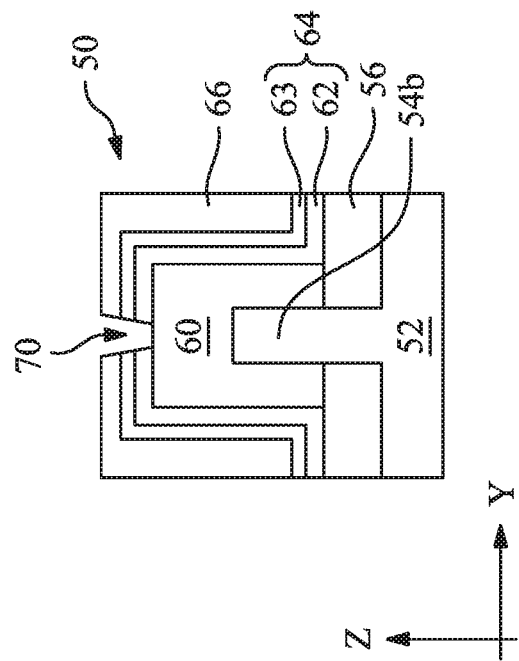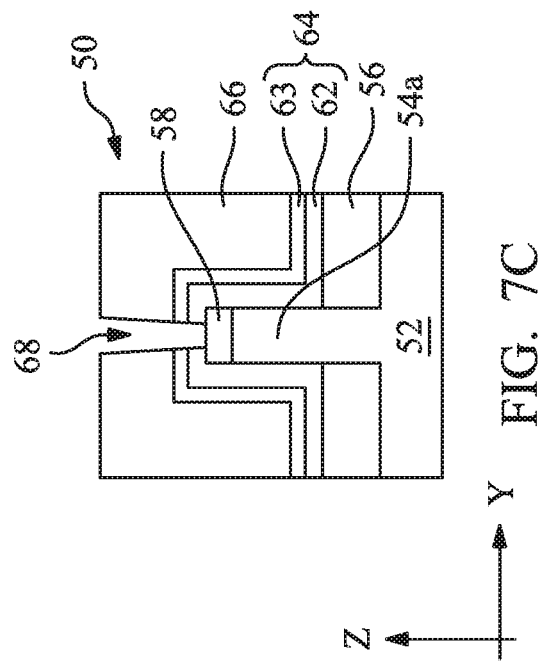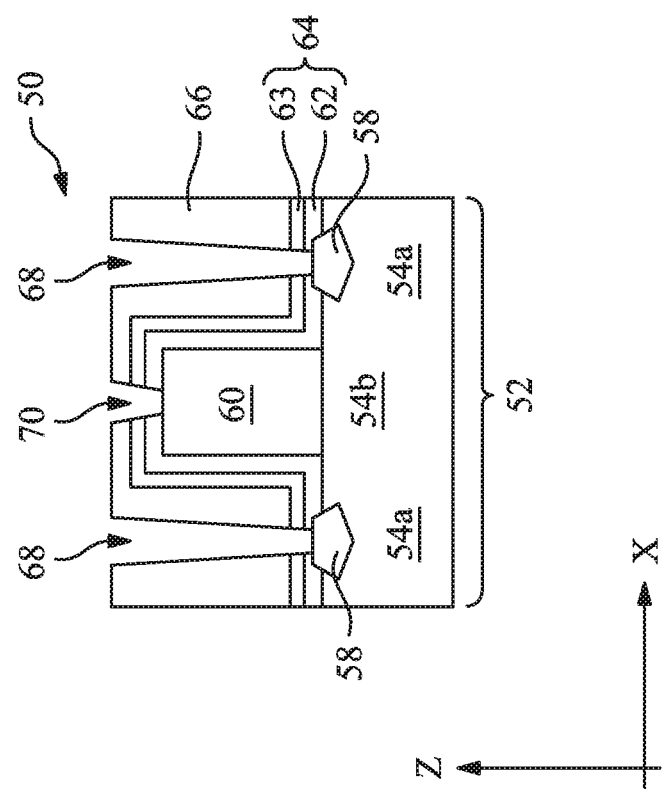

ETCH STOP LAYER FOR SEMICONDUCTOR DEVICES

PRIORITY

The present application is a divisional application of U.S. patent application Ser. No. 15/197,294, filed on Jun. 29, 2016, titled "Etch Stop Layer for Semiconductor Devices," the disclosure of which is incorporated herein in its entirety.

BACKGROUND

The semiconductor integrated circuit (IC) industry has experienced exponential growth. Technological advances in IC materials and design have produced generations of ICs where each generation has smaller and more complex circuits than the previous generation. In the course of IC evolution, functional density (i.e., the number of interconnected devices per chip area) has generally increased while geometry size (i.e., the smallest component (or line) that can be created using a fabrication process) has decreased. This scaling down process generally provides benefits by increasing production efficiency and lowering associated costs. Such scaling down has also increased the complexity of processing and manufacturing ICs and, for these advancements to be realized, similar developments in IC processing and manufacturing are needed.

For example, in IC manufacturing, it is typical that via (or plug) holes are etched through a low-k dielectric layer in order to make connections for interconnect structures. Across a wafer, the via holes may be distributed unevenly, with some areas of the wafer having dense via patterns and some areas having isolated via patterns. This creates a so-called "pattern loading effect" in the via etching process, causing some via holes to be over-etched and some via holes to be under-etched. To counter this problem, a traditional approach deposits a silicon-based etch stop layer between the low-k dielectric layer and the layer underneath. Ideally, all of the via holes should land at the silicon-based etch stop layer. However, as the semiconductor processes continue scaling down, this traditional silicon-based etch stop layer is no longer sufficient in certain cases. For example, conductor line widths may have a wider range in new designs and via holes may have a higher aspect ratio in new processes. As a result, the traditional silicon-based etch stop layer may not effectively prevent via hole over-etching and under-etching issues. Improvements in this area are desired.

BRIEF DESCRIPTION OF THE DRAWINGS

Aspects of the present disclosure are best understood from the following detailed description when read with the accompanying figures. It is emphasized that, in accordance with the standard practice in the industry, various features are not drawn to scale. In fact, the dimensions of the various features may be arbitrarily increased or reduced for clarity of discussion.

FIGS. 2A, 2B, 2C, 3A, 3B, 3C, 4A, 4B, 4C, 5A, 5B, 5C, 6A, 6B, 6C, 7A, 7B, 7C, 8A, 8B, and 8C are cross-sectional views of a portion of a semiconductor device in various fabrication stages according to an embodiment of the method in FIG. 1.

DETAILED DESCRIPTION

Figure 1:
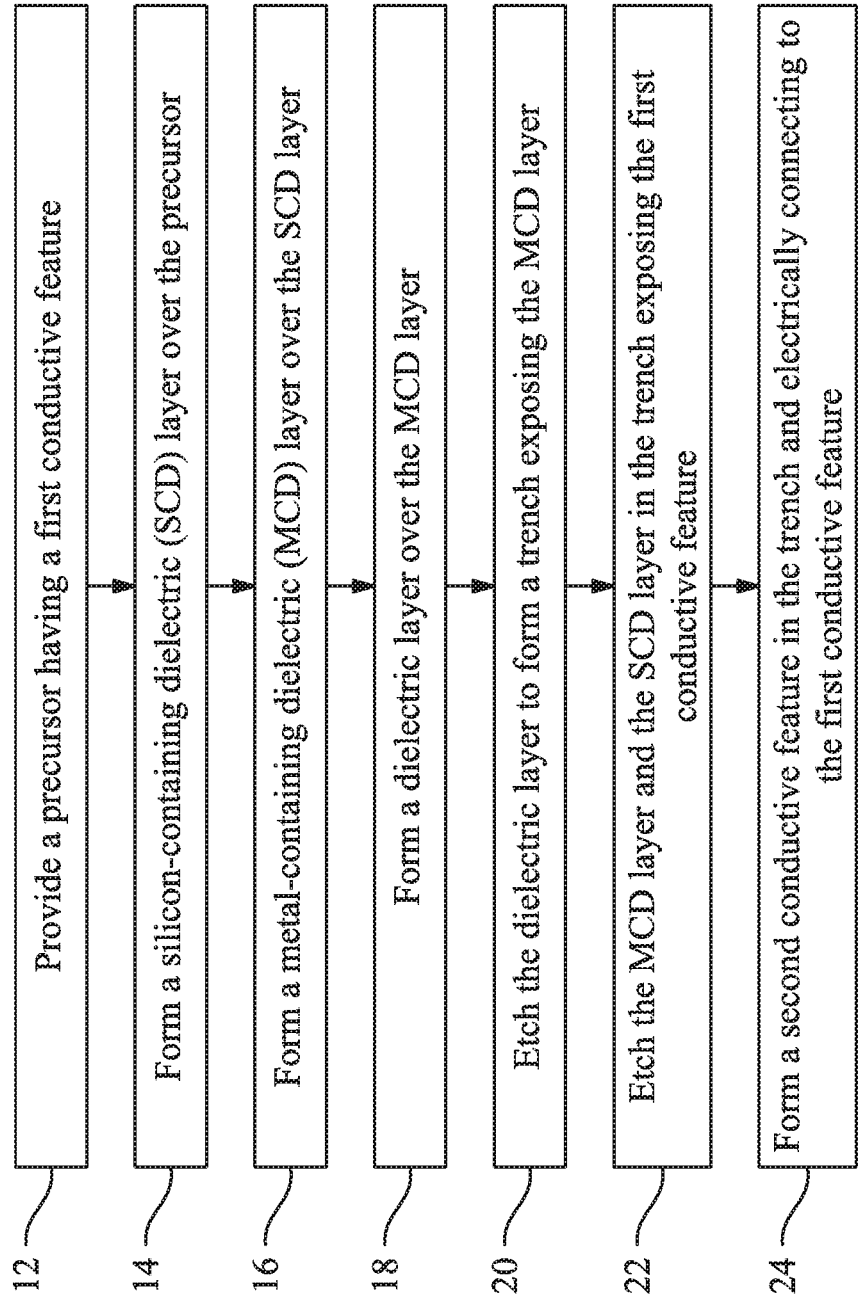
FIG. 1 is a flow chart of a method of forming a semiconductor device according to various aspects of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

The present disclosure in various embodiments is generally related to semiconductor devices and methods of forming the same. More particularly, the present disclosure is related to a new and improved etch stop layer for use in semiconductor manufacturing. In embodiments of the present disclosure, the etch stop layer includes a silicon-containing dielectric (SCD) layer and a metal-containing dielectric (MCD) layer over the SCD layer. The SCD layer functions as a barrier layer for preventing metal (e.g., copper) diffusion. It also functions as a hermetic layer between the MCD layer and the material (e.g., dielectric material) underneath the SCD layer. Both the SCD and the MCD layers are electrically insulating (non-conducting). Compared to traditional silicon-based etch stop layers, the MCD layer provides greater etch selectivity with respect to an overlying dielectric layer (e.g., a low-k material) that is to be etched. Therefore, the new etch stop layer can more effectively prevent via hole under-etching and over-etching issues than the traditional silicon-based etch stop layers. The new etch stop layer may be used in contact formation for transistor source, drain, and gate terminals; multi-layer interconnect formation for integrated circuits (IC); as well as other areas that may be recognized by persons having ordinary skill in the pertinent art. Various aspects of the new etch stop layer are discussed below in the context of forming exemplary source, drain, and gate terminals for a semiconductor device 50, and forming exemplary multi-layer interconnect structures for semiconductor devices 100, 200, and 300.

The semiconductor devices 50, 100, 200, and 300 are provided for illustration purposes and do not necessarily limit the embodiments of the present disclosure to any number of devices, any number of regions, or any configuration of structures or regions. Furthermore, each of the semiconductor devices 50, 100, 200, and 300 may be an intermediate device fabricated during processing of an IC, or a portion thereof, that may comprise static random access memory (SRAM) and/or logic circuits, passive components such as resistors, capacitors, and inductors, and active components such as p-type FETs (PFETs), n-type FETs (NFETs), FinFETs, metal-oxide semiconductor field effect transistors (MOSFET), complementary metal-oxide semiconductor (CMOS) transistors, bipolar transistors, high voltage transistors, high frequency transistors, other memory cells, and combinations thereof.

Figure 10:
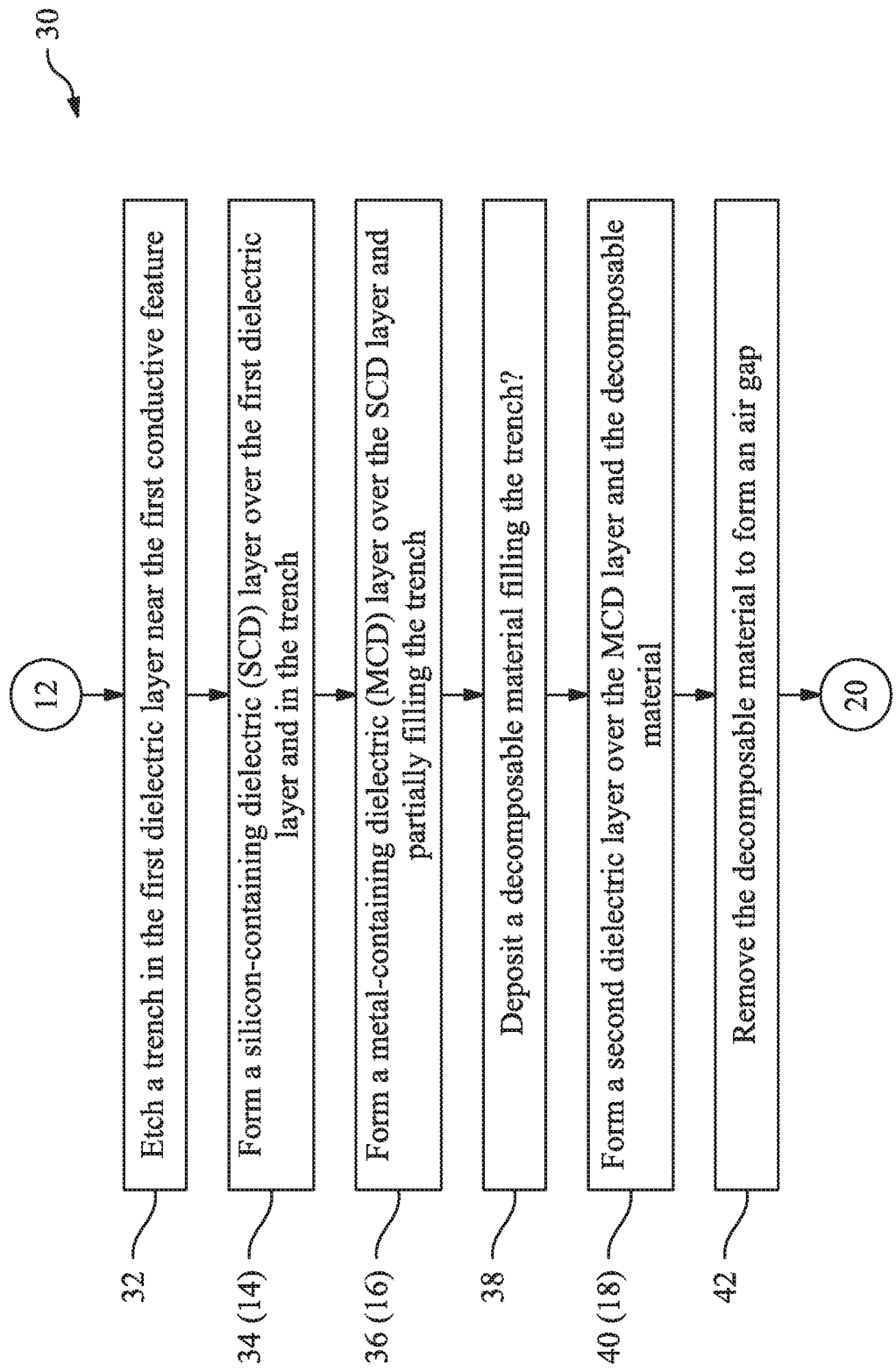
FIG. 10 is a flow chart of another embodiment of the method in FIG. 1.
Figure 11A:
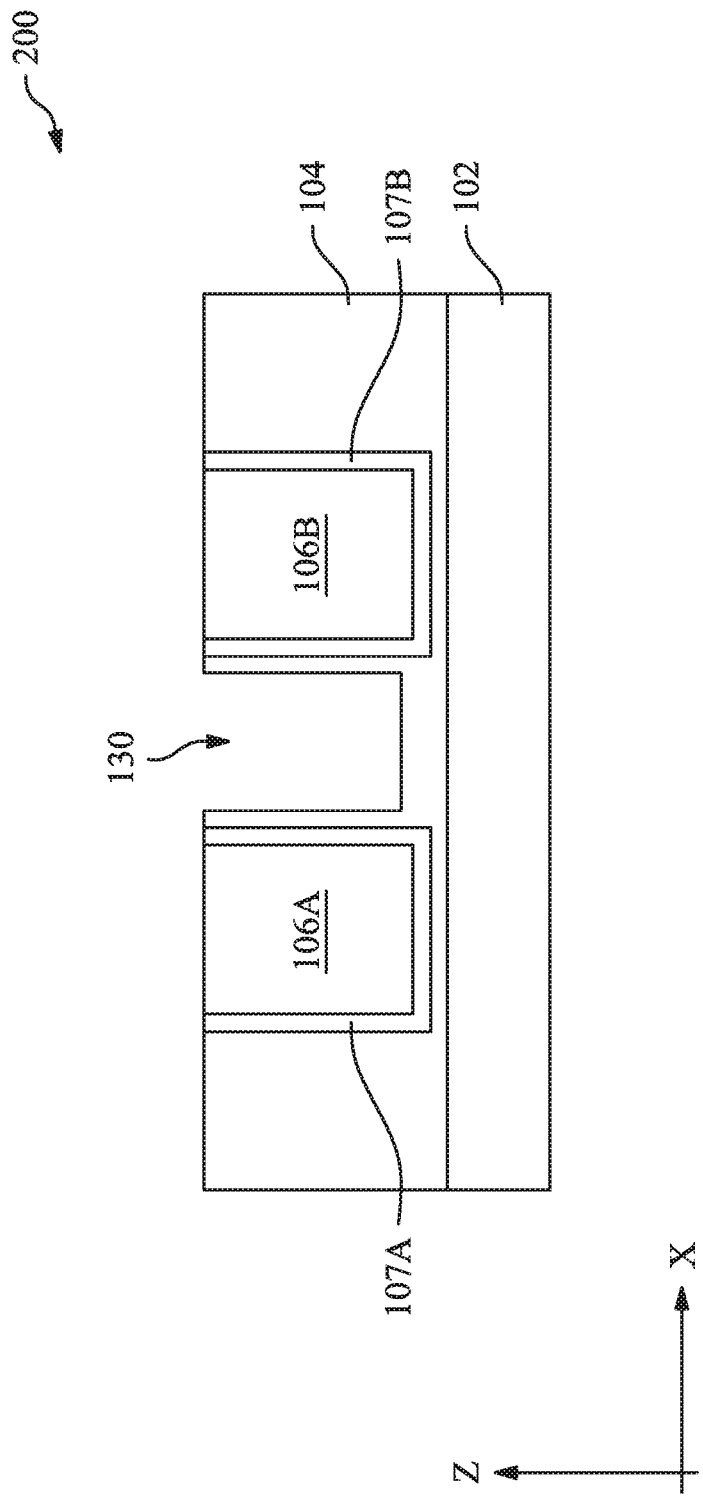
FIGS. 11A, 11B, 11C, 11D, 11E, 11F, and 11G are cross-sectional views of a portion of a semiconductor device in various fabrication stages according to the method in FIG. 10, in accordance with some embodiments.

FIG. 1 shows a flow chart of a method 10 of forming the semiconductor devices 50 and 100 using the new etch stop layer, according to various aspects of the present disclosure. FIGS. 10 and 12 show different embodiments of the method 10 in forming the semiconductor devices 200 and 300 using the new etch stop layer. The method 10, including its various embodiments, is merely an example, and is not intended to limit the present disclosure beyond what is explicitly recited in the claims. Additional operations can be provided before, during, and after the method 10, and some operations described can be replaced, eliminated, or moved around for additional embodiments of the method. The method 10 is described below in conjunction with FIGS. 2A-8C, 9A-9G, 11A-11G, and 13A-13C which are cross-sectional views of the respective semiconductor devices 50, 100, 200, and 300 in various stages of a manufacturing process.

First Embodiment

The first embodiment of the method 10 is described below with reference to FIGS. 1 and 2A-8C in forming the device 50. As will be shown, the device 50 is a multi-gate device. More particularly, it is a FinFET device. In that regard, FIGS. 2A, 3A, 4A, 5A, 6A, 7A, and 8A illustrate cross-sectional views of the device 50 cut along the length of the fin; FIGS. 2B, 3B, 4B, 5B, 6B, 7B, and 8B illustrate cross-sectional views of the device 50 cut along the width of the fin in the channel region of the device 50; and FIGS. 2C, 3C, 4C, 5C, 6C, 7C, and 8C illustrate cross-sectional views of the device 50 cut along the width of the fin in the source/drain (S/D) region of the device 50. Persons having ordinary skill in the art should recognize that embodiments of the method 10 can be used in forming planar transistors in addition to multi-gate devices.

Figure 2B:
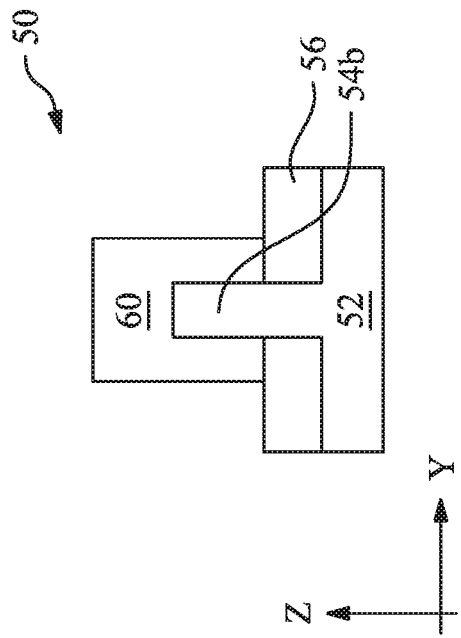
Figure 2C:
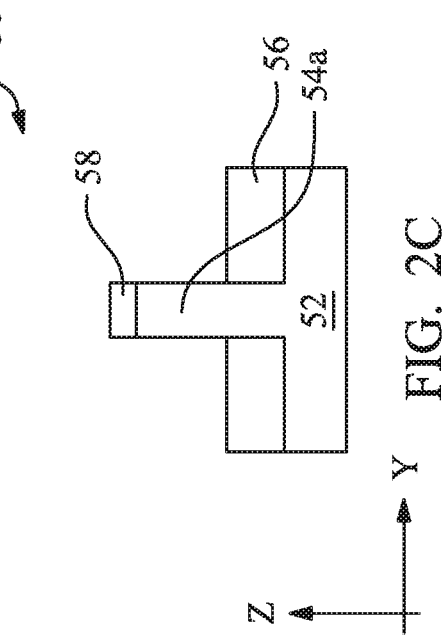
Figure 2A:
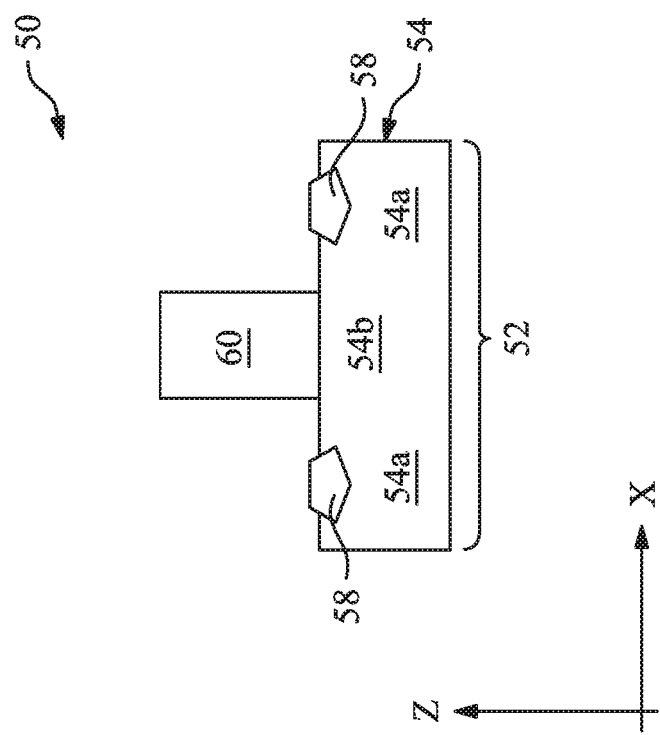

Referring to FIG. 1, at operation 12, the method 10 provides a precursor of the device 50 as shown in FIGS. 2A, 2B, and 2C. For the convenience of discussion, the precursor of the device 50 is also referred to as the device 50. Referring to FIGS. 2A, 2B, and 2C collectively, the device 50 includes a substrate 52, a fin 54 protruding from the substrate 52 and having two S/D regions 54a and a channel region 54b between the S/D regions 54a, an isolation structure 56 over the substrate 52 and surrounding the lower portion of the fin 54, and a gate structure 60 over the isolation structure 56 and engaging the fin 54 at the channel region 54b. The device 50 further includes S/D features 58 in and/or on the S/D regions 54a. The S/D features 58 are conductive features. In embodiments, the gate structure 60 also includes conductive features. The various features of the device 50 are further described below.

In embodiments, the substrate 52 includes a silicon substrate (e.g., a wafer). Alternatively, the substrate 52 may comprise another elementary semiconductor, such as germanium; a compound semiconductor including silicon carbide, gallium arsenic, gallium phosphide, indium phosphide, indium arsenide, and/or indium antimonide; an alloy semiconductor including SiGe, GaAsP, AlInAs, AlGaAs, GaInAs, GaInP, and/or GaInAsP; or combinations thereof. In yet another alternative, the substrate 52 is a semiconductor on insulator (SOI).

The fin 54 may be suitable for forming a P-type FinFET or an N-type FinFET. The fin 54 may be fabricated using suitable processes including photolithography and etch processes. The photolithography process may include forming a photoresist layer (resist) overlying the substrate 52, exposing the resist to a pattern, performing post-exposure bake processes, and developing the resist to form a masking element including the resist. The masking element is then used for etching recesses into the substrate 52, leaving the fin 54 on the substrate 52. The etching process can include dry etching, wet etching, reactive ion etching (RIE), and/or other suitable processes. For example, a dry etching process may implement an oxygen-containing gas, a fluorine-containing gas (e.g., $CF_4$, $SF_6$, $CH_2F_2$, $CHF_3$, and/or $C_2F_6$), a chlorine-containing gas (e.g., $Cl_2$, $CHCl_3$, $CCl_4$, and/or $BCl_3$), a bromine-containing gas (e.g., HBr and/or $CHBR_3$), an iodine-containing gas, other suitable gases and/or plasmas, and/or combinations thereof. For example, a wet etching process may comprise etching in diluted hydrofluoric acid (DHF); potassium hydroxide (KOH) solution; ammonia; a solution containing hydrofluoric acid (HF), nitric acid ($HNO_3$), and/or acetic acid ($CH_3COOH$); or other suitable wet etchant. Alternatively, the fin 54 may be formed by double-patterning lithography (DPL) process. Numerous other embodiments of methods to form the fin 54 on the substrate 52 may be suitable.

The isolation structure 56 may be formed of silicon oxide, silicon nitride, silicon oxynitride, fluoride-doped silicate glass (FSG), a low-k dielectric material, and/or other suitable insulating material. The isolation structure 56 may be shallow trench isolation (STI) features. In an embodiment, the isolation structure 56 is formed by etching trenches in the substrate 52, e.g., as part of the fin 54 formation process. The trenches may then be filled with isolating material, followed by a chemical mechanical planarization (CMP) process. Other isolation structure 56 such as field oxide, LOCal Oxidation of Silicon (LOCOS), and/or other suitable structures are possible. The isolation structure 56 may include a multi-layer structure, for example, having one or more thermal oxide liner layers.

In an embodiment, the S/D features 58 may include lightly doped S/D (LDD), heavily doped S/D (HDD), and/or silicidation. In an example, lightly or heavily doped S/D may be formed by etching into the S/D regions 54a and performing a selective epitaxial growth (SEG) using a silicon-based precursor gas. The grown S/D (e.g., silicon) may be doped with a proper dopant in-situ during the SEG or in a subsequent process. An annealing process, such as a rapid thermal annealing and/or a laser thermal annealing, may be performed to activate the dopant. In an example, silicidation may include nickel silicide (NiSi), nickel-platinum silicide (NiPtSi), nickel-platinum-germanium silicide (NiPtGeSi), nickel-germanium silicide (NiGeSi), ytterbium silicide (YbSi), platinum silicide (PtSi), iridium silicide (IrSi), erbium silicide (ErSi), cobalt silicide (CoSi), other suitable conductive materials, and/or combinations thereof. The silicidation may be formed by a process that includes depositing a metal layer, annealing the metal layer such that the metal layer is able to react with silicon to form silicide, and then removing the non-reacted metal layer.

The gate structure 60 engages the fin 54 on two or more sides (three sides in the example shown). The gate structure 60 may include a gate dielectric layer, a gate electrode layer, and one or more additional layers such as an interfacial layer, a work function layer, and a hard mask layer. The dielectric layer may include silicon oxide or a high-k dielectric such as hafnium oxide ($HfO_2$), zirconium oxide ($ZrO_2$), lanthanum oxide ($La_2O_3$), titanium oxide ($TiO_2$), yttrium oxide ($Y_2O_3$), strontium titanate ($SrTiO_3$), other suitable metal-oxides, or combinations thereof. The gate electrode layer may include polysilicon in an embodiment. Alternatively, the gate electrode may include a metal such as aluminum (Al), tungsten (W), or copper (Cu) and/or other suitable materials. The gate structure 60 may include a gate spacer in some embodiments. The various layers of the gate structure 60 may be formed by chemical oxidation, thermal oxidation, atomic layer deposition (ALD), chemical vapor deposition (CVD), physical vapor deposition (PVD), plating, or other suitable methods.

Referring to FIG. 1, at operation 14, the method 10 forms a SCD layer 62 over the substrate 52. More particularly, the SCD layer 62 is formed over the fin 54, the isolation structure 56, the S/D features 58, and the gate structure 60, as shown in FIGS. 3A, 3B, and 3C. The SCD layer 62 may be formed as a conformal layer or a non-conformal layer in various embodiments. In an embodiment, the SCD layer 62 comprises silicon and one of oxygen, carbon, and nitrogen. For example, the SCD layer 62 may comprise silicon carbide (SiC), silicon nitride (SiN), or silicon oxide ($SiO_2$). In an alternative embodiment, the SCD layer 62 comprises silicon and a combination of oxygen, carbon, and/or nitrogen. For example, the SCD layer 62 may comprise silicon carbon nitride (SiCN), silicon carbon oxide (SiON), or silicon oxynitride (SiON). The SCD layer 62 may be deposited using PVD, CVD, plasma-enhanced CVD (PECVD), ALD, plasma-enhanced ALD (PEALD), or other deposition techniques. In an embodiment, the SCD layer 62 is deposited in a chamber with a temperature ranging from room temperature to about 600 degrees Celsius and at a pressure ranging from 0 to 100 torr. The thickness of the SCD layer 62 may be controlled to achieve a balance in design needs. A thicker SCD layer 62 may provide better metal-barrier and hermetic functions, at the expense of increased package size. In some embodiments, the SCD layer 62 is controlled to be thinner than 1000 angstrom (Å). For example, the SCD layer 62 may be deposited to a thickness ranging from 5 Å to 300 Å.

At operation 16, the method 10 (FIG. 1) forms a MCD layer 63 over the SCD layer 62. Referring to FIGS. 4A, 4B, and 4C, the MCD layer 63 may be formed as a conformal layer or a non-conformal layer in various embodiments. In an embodiment, the MCD layer 63 comprises an oxide of a metal material or a nitride of a metal material. In embodiments, the metal material may comprise aluminum (Al), tantalum (Ta), titanium (Ti), hafnium (Hf), or other metals. For example, the MCD layer 63 may comprise aluminum nitride, aluminum oxide, tantalum oxide, titanium oxide, hafnium oxide, other metal oxide compounds, or other metal nitride compounds. The MCD layer 63 is electrically insulating and has large etching selectivity with respect to a low-k dielectric material, which will be discussed later. The MCD layer 63 may be deposited using PVD, CVD, PECVD, ALD, PEALD, plating (electro or electro-less), or other deposition techniques. In an embodiment, the MCD layer 63 is deposited in a chamber with a temperature ranging from room temperature to about 600 degrees Celsius and at a pressure ranging from 0 to 100 torr. The SCD layer 62 and the MCD layer 63 may be deposited in the same process chamber. The thickness of the MCD layer 63 may be controlled to achieve a balance in design needs. A thicker MCD layer 63 may provide a stronger etch-stop function, at the expense of increased package size. In embodiments, the MCD layer 63 is thinner than 500 Å. For example, the MCD layer 63 may be deposited to a thickness ranging from 5 Å to 100 Å. In the present embodiment, the new etch stop layer 64 includes the SCD layer 62 and the MCD layer 63. The etch stop layer 64 is generally thinner than traditional silicon-based etch stop layers because the MCD layer 63 can be made thinner while providing stronger etch-stop function.

Figure 5B:
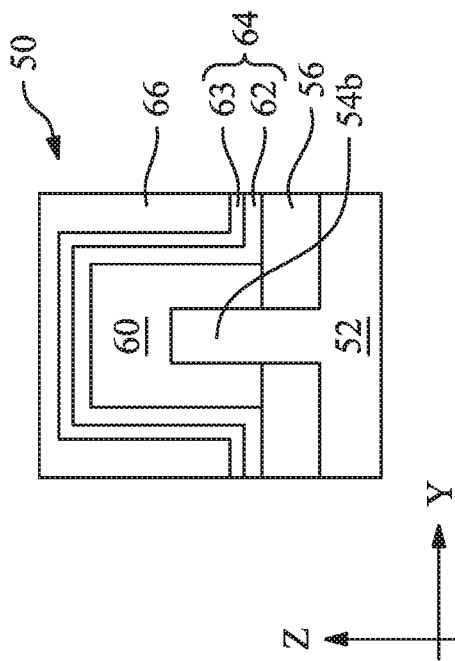
Figure 5C:
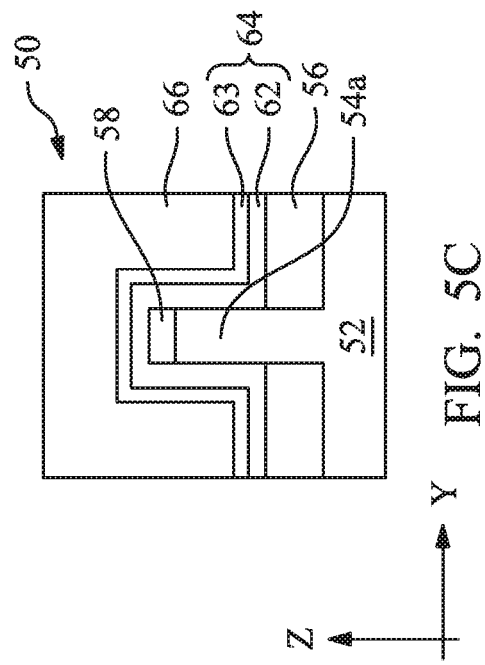
Figure 5A:
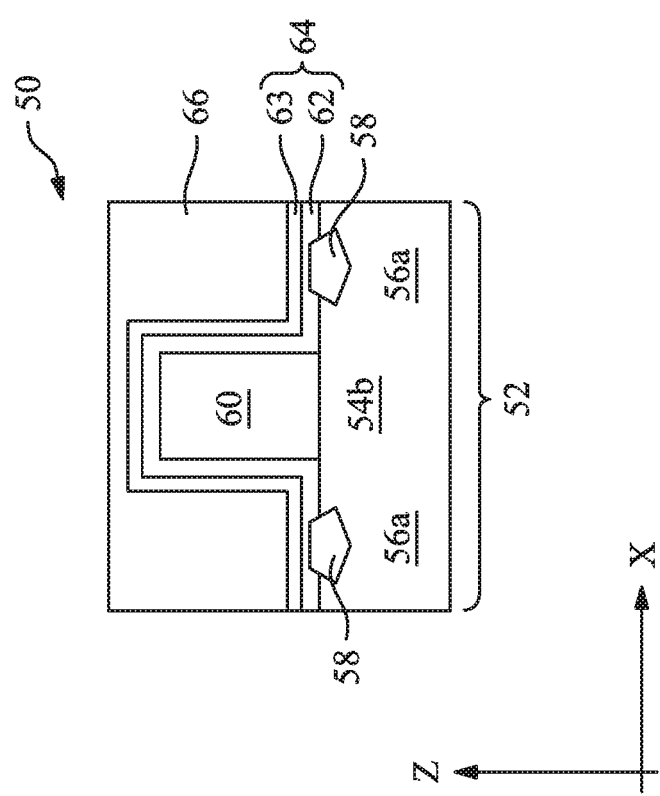

At operation 18, the method 10 (FIG. 1) forms a dielectric layer 66 over the etch stop layer 64 and filling various trenches over the substrate 52. Referring to FIGS. 5A, 5B, and 5C, the dielectric layer 66 may comprise a low-k dielectric material such as tetraethylorthosilicate (TEOS) oxide, un-doped silicate glass, or doped silicon oxide such as borophosphosilicate glass (BPSG), fused silica glass (FSG), phosphosilicate glass (PSG), boron doped silicon glass (BSG), and/or other suitable dielectric materials. In some embodiments, the dielectric layer 66 comprises a material having a dielectric constant (k value) lower than or equal to 3. In some embodiments, the dielectric layer 66 comprises an extreme low-k dielectric material, for example, with k lower than 2.3. The dielectric layer 66 may be deposited using PVD, CVD, low-pressure CVD (LPCVD), plasma-enhanced CVD (PECVD), flowable CVD (FCVD), or other suitable deposition techniques. A chemical mechanical planarization (CMP) process may be performed to planarize a top surface of the dielectric layer 66, which is the top surface of the device 50.

Figure 6B:
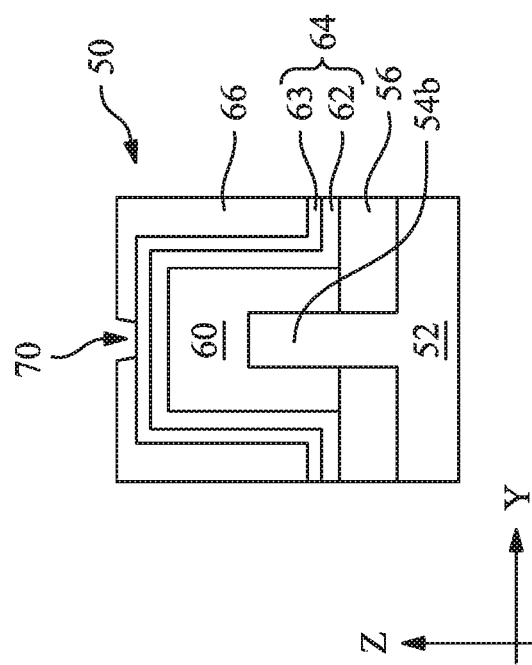
Figure 6C:
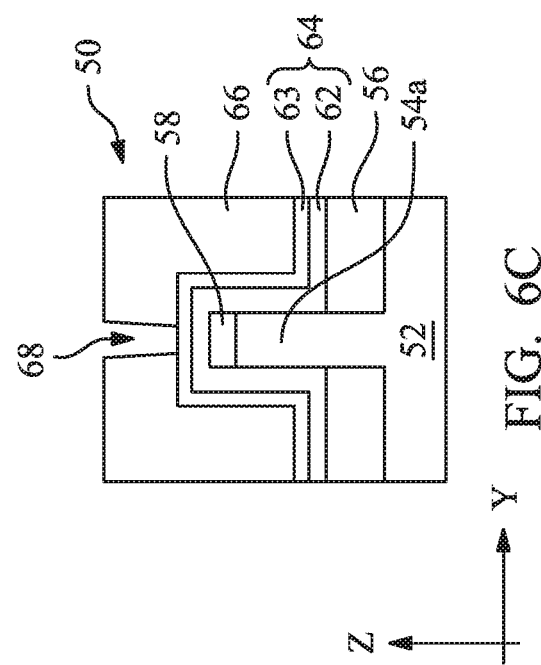
Figure 6A:
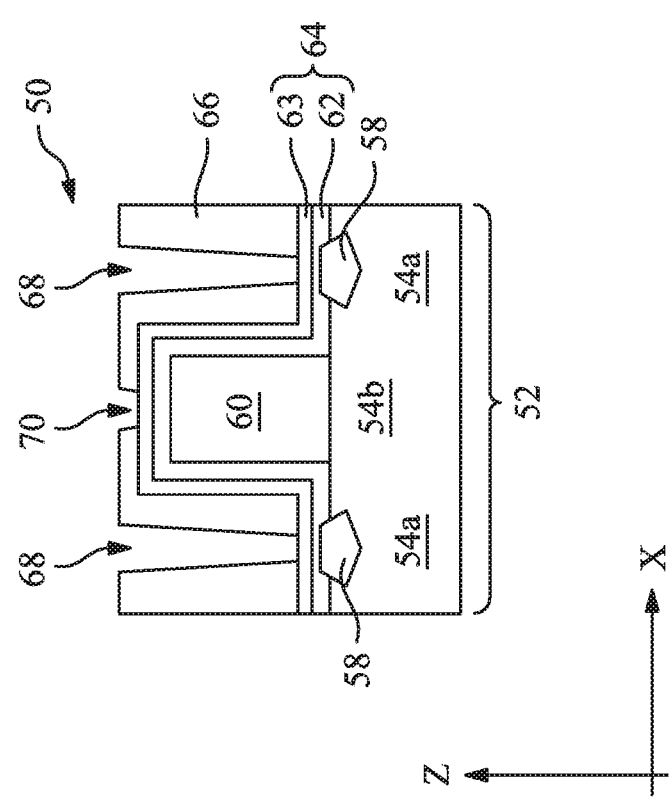

At operation 20, the method 10 (FIG. 1) etches the dielectric layer 66 to form trenches 68 and 70 therein. Referring to FIGS. 6A, 6B, and 6C, the trenches 68 are formed over the S/D features 58, and the trench 70 is formed over the gate structure 60. The trenches 68 and 70 expose the MCD layer 63 in the S/D regions 54a and over the gate structure 60, respectively. In embodiments, the trenches 68 and 70 may be formed in separate processes or in the same process. For the convenience of discussion, the forming of the trenches 68 and 70 are collectively discussed below.

In embodiments, operation 20 may include one or more photolithography processes and one or more etching processes. For example, the photolithography process may include forming a photoresist (or resist) layer overlying the dielectric layer 66, exposing the resist to a pattern, performing post-exposure bake processes, and developing the resist to form a masking element including the resist. The masking element is then used for etching trenches into the dielectric layer 66. In an embodiment, one or more patterning layers, such as a hard mask layer and/or an anti-reflective coating layer, may be deposited between the dielectric layer 66 and the resist layer before the resist layer is patterned. To further this embodiment, the pattern is transferred from the resist layer to the one or more patterning layers, and then to the dielectric layer 66.

The etching of the dielectric layer 66 may use dry etching, wet etching, and/or other suitable processes as discussed above. The etching process is selectively tuned to remove the material(s) of the dielectric layer 66 but not the material(s) of the MCD layer 63. Due to various factors such as uneven via pattern distribution, variations in CDs, and high aspect ratios of via trenches, some via trenches may reach the MCD layer 63 earlier than other via trenches. When one via (e.g., trench 68 on the left) has reached the MCD layer 63 while another via (e.g., trench 68 on the right) has not, continuous etching is performed to ensure all via trenches reach the MCD layer 63. Otherwise, under-etched via trenches would lead to open circuit defects. With traditional silicon-based etch stop layers, the continuous etching might over-etch and penetrate the silicon-based etch stop layer, and damage the features underneath. In the present embodiment, the MCD layer 63 has large etching selectivity with respect to the dielectric layer 66 and can therefore withstand the continuous etching operation. In the present embodiment, all via trenches reach, and stop at, the MCD layer 63 during operation 20.

At operation 22, the method 10 (FIG. 1) etches and opens the etch stop layer 64 including the MCD layer 63 and the SCD layer 62. Referring to FIGS. 7A, 7B, and 7C, the MCD layer 63 and the SCD layer 62 are etched and removed within the trenches 68 and 70. As a result, the conductive features, including the S/D features 58 and the gate structure 60, are exposed in the trenches 68 and 70 respectively. Operation 22 may include one or more dry etching, wet etching, or other suitable etching techniques that are selectively tuned to remove the materials of the etch stop layer 64 while the dielectric layer 66 remains substantially unchanged. In an embodiment, operation 22 includes one or more anisotropic etching processes. A cleaning process may be performed to remove etching residues from the exposed portions of the conductive features.

Figure 8B:
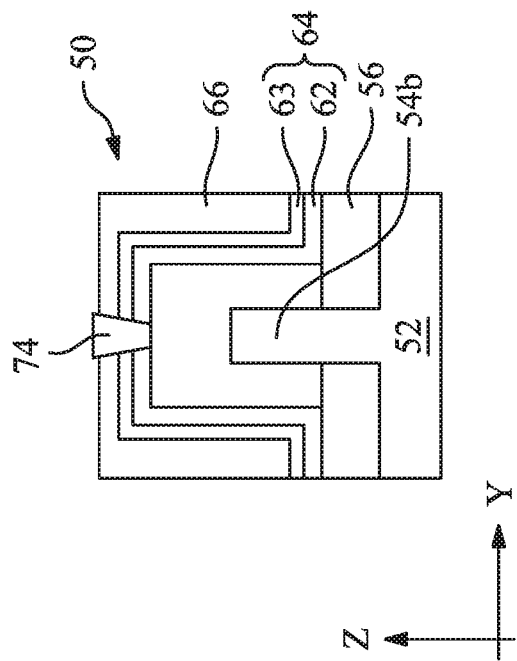
Figure 8C:
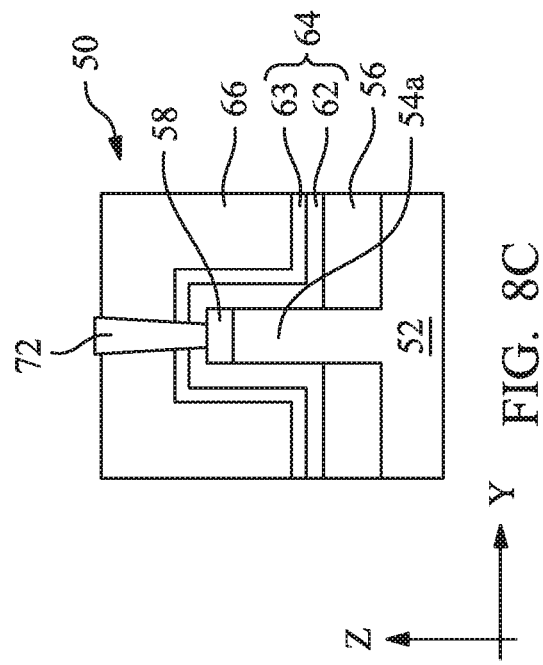
Figure 8A:
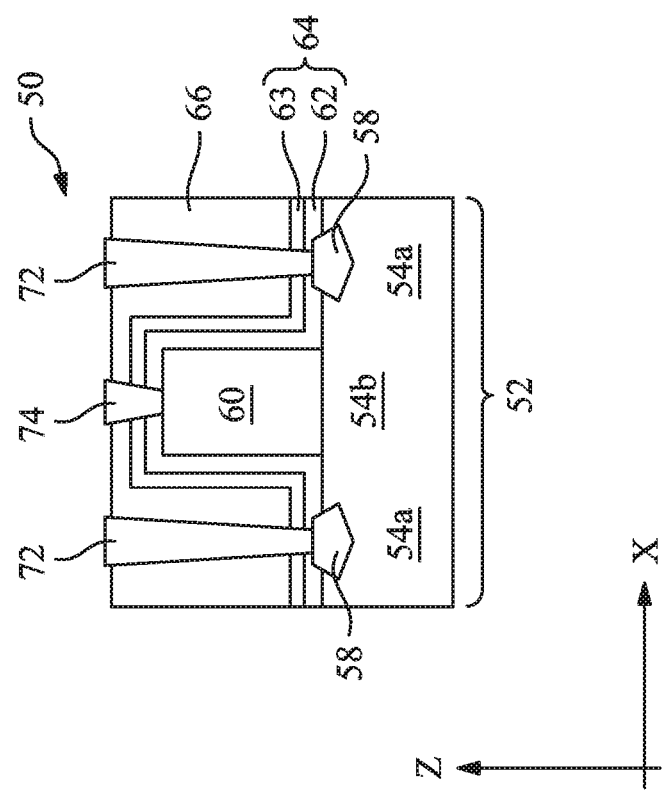

At operation 24, the method 10 (FIG. 1) forms conductive features 72 and 74 in the trenches 68 and 70 respectively. Referring to FIGS. 8A, 8B, and 8C, the conductive features 72 (S/D contacts) are electrically connected to the S/D features 58; while the conductive feature 74 (gate contact) is electrically connected to the gate structure 60. In embodiments, the conductive features 72 and 74 may be formed in separate processes or in the same process. Each of the conductive features 72 and 74 may use a metal, such as aluminum (Al), tungsten (W), copper (Cu), cobalt (Co), or other suitable material. In an embodiment, operation 24 forms a barrier layer in the trenches 68 and 70 before the forming of the conductive features 72 and 74, respectively. The barrier layer prevents the material of the conductive feature 72 and 74 from diffusing into the dielectric layer 66. Each of the conductive features 72 and 74 may be formed by CVD, PVD, ALD, plating, or other suitable methods.

Still referring to FIGS. 8A, 8B, and 8C, in this fabrication stage, the device 50 comprises the substrate 52 and the conductive features 72 and 74, each over a portion of the substrate 52. The device 50 further comprises the new and improved etch stop layer 64 that includes the SCD layer 62 and the MCD layer 63 over the SCD layer 62. The device 50 further comprises the dielectric layer 66 over the etch stop layer 64. The device 50 further comprises the conductive features 72 and 74 in the dielectric layer 66. The conductive features 72 and 74 penetrate the etch stop layer 64 and electrically connect to the S/D features 58 and gate structure 60, respectively. In some embodiments, the portion of the etch stop layer 64 over the top of the gate structure 60 may be absent. For example, the device 50 may undergo a replacement gate process that removes that portion of the etch stop layer 64.

The method 10 may proceed to further steps to fabricate the device 50. For example, the method 10 may form additional dielectric layers over the dielectric layer 66 and form interconnect structures in the dielectric layers to connect various terminals of the FinFET to other passive and/or active devices to form a complete IC.

Second Embodiment

The second embodiment of the method 10 is described below with reference to FIGS. 1 and 9A-9G in forming the device 100.

Figure 9A:
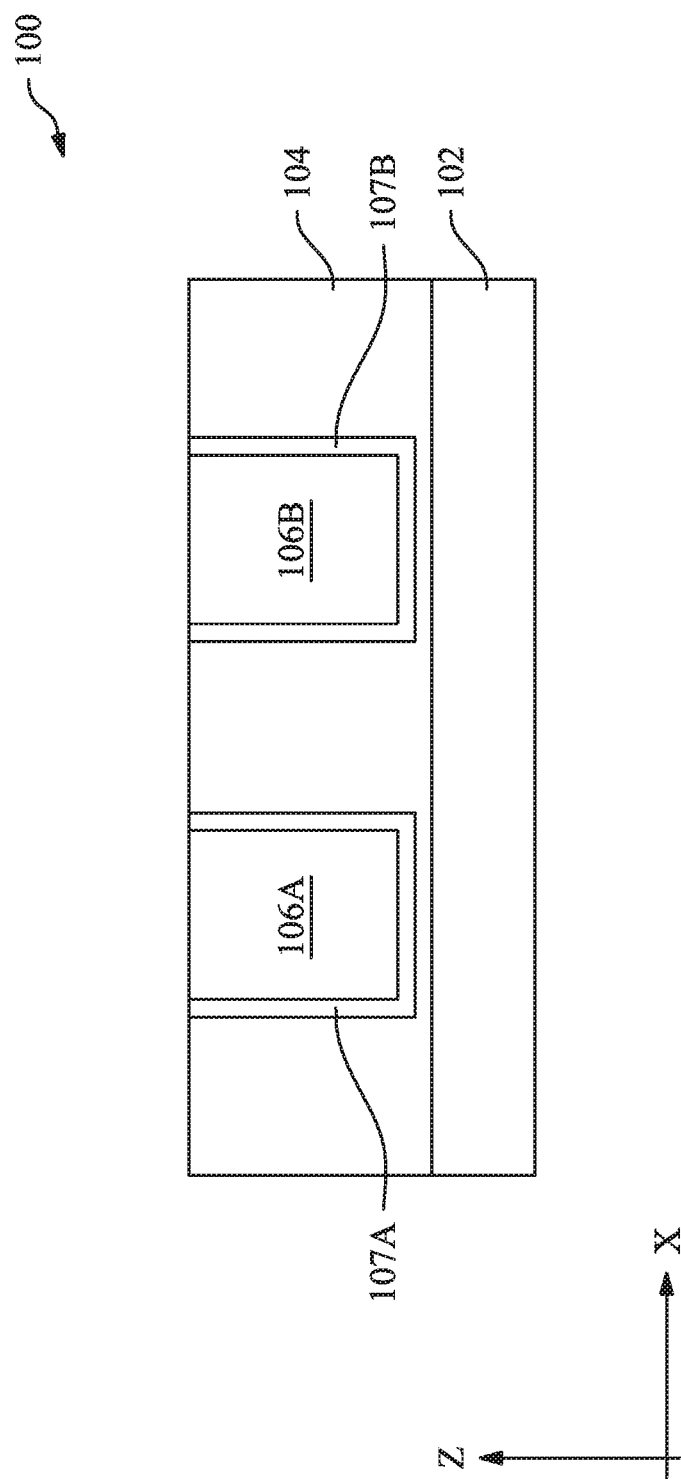
FIGS. 9A, 9B, 9C, 9D, 9E, 9F, and 9G are cross-sectional views of a portion of another semiconductor device in various fabrication stages according to an embodiment of the method in FIG. 1.

Referring to FIG. 1, at operation 12, the method 10 provides a precursor of the device 100 as shown in FIG. 9A. For the convenience of discussion, the precursor of the device 100 is also referred to as the device 100. Referring to FIG. 9A, the device 100 includes a substrate 102, a dielectric layer 104 over the substrate 102, and conductive features 106A and 106B in the dielectric layer 104. In this embodiment as shown, the device 100 further includes barrier layers 107A and 107B between the conductive features 106A and 106B and the dielectric layer 104.

In embodiments, the substrate 102 includes a silicon substrate (e.g., a wafer). Alternatively, the substrate 102 may comprise another elementary semiconductor, such as germanium; a compound semiconductor including silicon carbide, gallium arsenic, gallium phosphide, indium phosphide, indium arsenide, and/or indium antimonide; an alloy semiconductor including SiGe, GaAsP, AlInAs, AlGaAs, GaInAs, GaInP, and/or GaInAsP; or combinations thereof. In yet another alternative, the substrate 102 is a semiconductor on insulator (SOI). The substrate 102 includes active devices such as p-type field effect transistors (PFET), n-type FET (NFET), metal-oxide semiconductor field effect transistors (MOSFET), complementary metal-oxide semiconductor (CMOS) transistors, bipolar transistors, high voltage transistors, and high frequency transistors. The transistors may be planar transistors or multi-gate transistors such as FinFETs. The substrate 102 may further include passive devices such as resistors, capacitors, and inductors.

In embodiments, the dielectric layer 104 comprises a low-k dielectric material such as tetraethylorthosilicate (TEOS) oxide, un-doped silicate glass, or doped silicon oxide such as borophosphosilicate glass (BPSG), fused silica glass (FSG), phosphosilicate glass (PSG), boron doped silicon glass (BSG), and/or other suitable dielectric materials. In some embodiments, the dielectric layer 104 comprises a material having a dielectric constant (k value) lower than or equal to 3. In some embodiments, the dielectric layer 104 comprises an extreme low-k dielectric material, for example, with k lower than 2.3.

The conductive features 106A and 106B are part of a multi-layer interconnect structure of the device 100. In an embodiment, the conductive features 106A and 106B are contacts (or plugs) for transistor source, drain, or gate terminals. In another embodiment, the conductive features 106A and 106B are metal-x (Mx) level interconnects (e.g., metal wire features). For example, "x" may be 0, 1, 2, and so on. Although not shown, the conductive features 106A and 106B are coupled to active and/or passive devices in the substrate 102 (such as the FinFET in the device 50) through underlying layers of the interconnect structure or through the terminals (e.g., source, drain, and gate contacts) of the active and/or passive devices. In embodiments, the conductive features 106A and 106B may comprise copper (Cu), aluminum (Al), tungsten (W), cobalt (Co), or other suitable metals.

The barrier layers 107A and 107B may be electrically conductive or insulating. The barrier layers 107A and 107B are disposed between the respective conductive features 106A and 106B and the dielectric layer 104 and act as metal-diffusion barriers. In embodiments, the barrier layers 107A and 107B may comprise titanium (Ti), titanium nitride (TiN), tantalum (Ta), tantalum nitride (TaN), or other suitable material; and may include one or more layers of material.

The precursor 100 may be formed by a variety of processes. In one example, the precursor 100 is formed by depositing the dielectric layer 104 over the substrate 102, etching the dielectric layer 104 to form trenches, depositing the barrier layers 107A and 107B as a liner in the trenches, depositing the conductive features 106A and 106B in the trenches over the barrier layers, and performing a CMP process to remove excessive materials of the barrier layers and the conductive features. In another example, the precursor 100 is formed by depositing a metal layer over the substrate 102, etching the metal layer (e.g., using reactive ion etching) to form the conductive features 106A and 106B, depositing the barrier layers 107A and 107B around the conductive features 106A and 106B, depositing the dielectric layer 104 over the substrate 102 and covering the conductive features 106A and 106B, and performing a CMP process to remove excessive materials of the dielectric layer 104 and the barrier layers 107A/B.

In various embodiments, the dielectric layer 104 may be deposited using PVD, CVD, LPCVD, PECVD, FCVD, or other suitable deposition techniques. The dielectric layer 104 may be etched using a dry (plasma) etching, a wet etching, or other etching techniques. The barrier layers 107A and 107B may be deposited using PVD, CVD, ALD, or other deposition techniques. The conductive features 106A and 106B may be formed by sputtering, CVD, plating (electro or electro-less), or other deposition techniques.

Figure 9B:
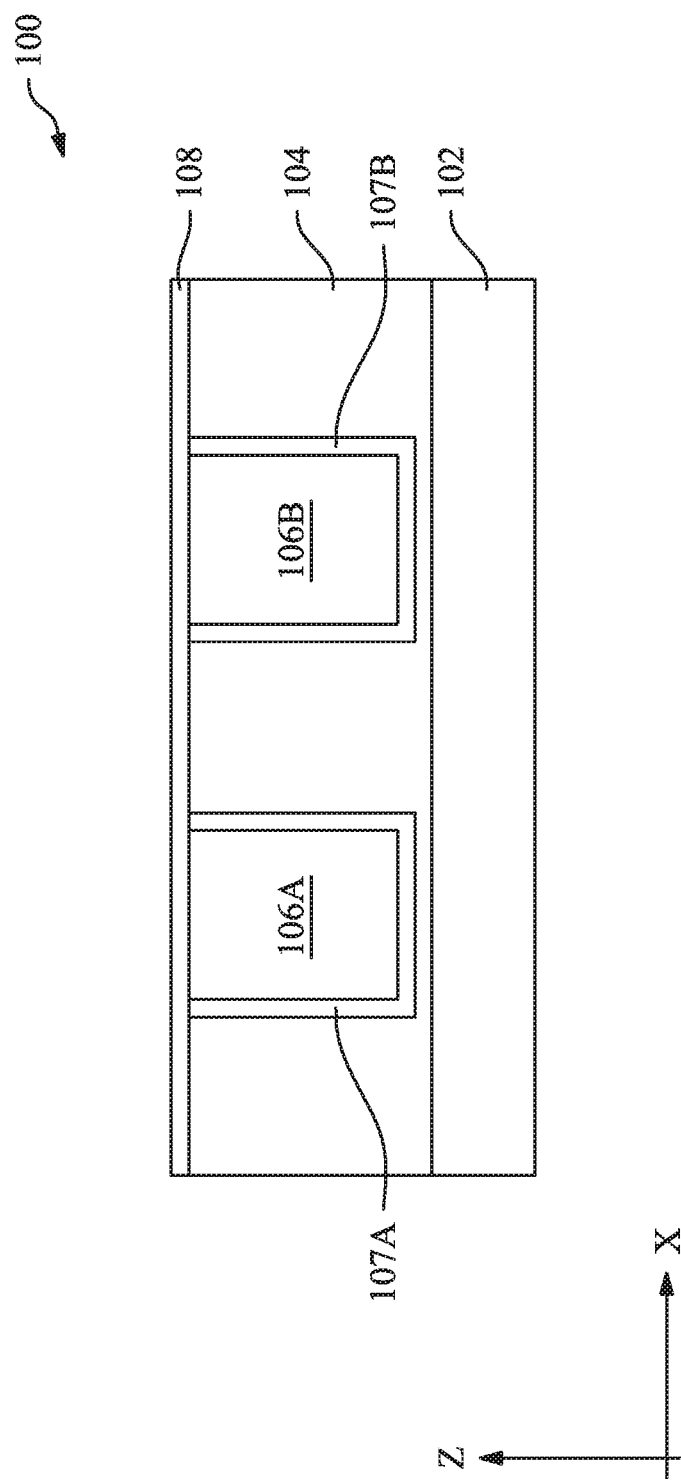

At operation 14, the method 10 (FIG. 1) forms a SCD layer 108 over the dielectric layer 104. Referring to FIG. 9B, the SCD layer 108 may be formed as a conformal layer or a non-conformal layer in various embodiments. In an embodiment, the SCD layer 108 comprises silicon and one of oxygen, carbon, and nitrogen. For example, the SCD layer 108 may comprise silicon carbide (SiC), silicon nitride (SiN), or silicon oxide (SiO$_2$). In an alternative embodiment, the SCD layer 108 comprises silicon and a combination of oxygen, carbon, and/or nitrogen. For example, the SCD layer 108 may comprise silicon carbon nitride (SiCN), silicon carbon oxide (SiON), or silicon oxynitride (SiON). The SCD layer 108 may be deposited using PVD, CVD, PECVD, ALD, PEALD, or other deposition techniques. In an embodiment, the SCD layer 108 is deposited in a chamber with a temperature ranging from room temperature to about 600 degrees Celsius and at a pressure ranging from 0 to 100 torr. The thickness of the SCD layer 108 may be controlled to achieve a balance in design needs. A thicker SCD layer 108 may provide better metal-barrier and hermetic functions, at the expense of increased package size. In some embodiments, the SCD layer 108 is controlled to be thinner than 1000 angstrom (Å). For example, the SCD layer 108 may be deposited to a thickness ranging from 5 Å to 300 Å.

Figure 9C:
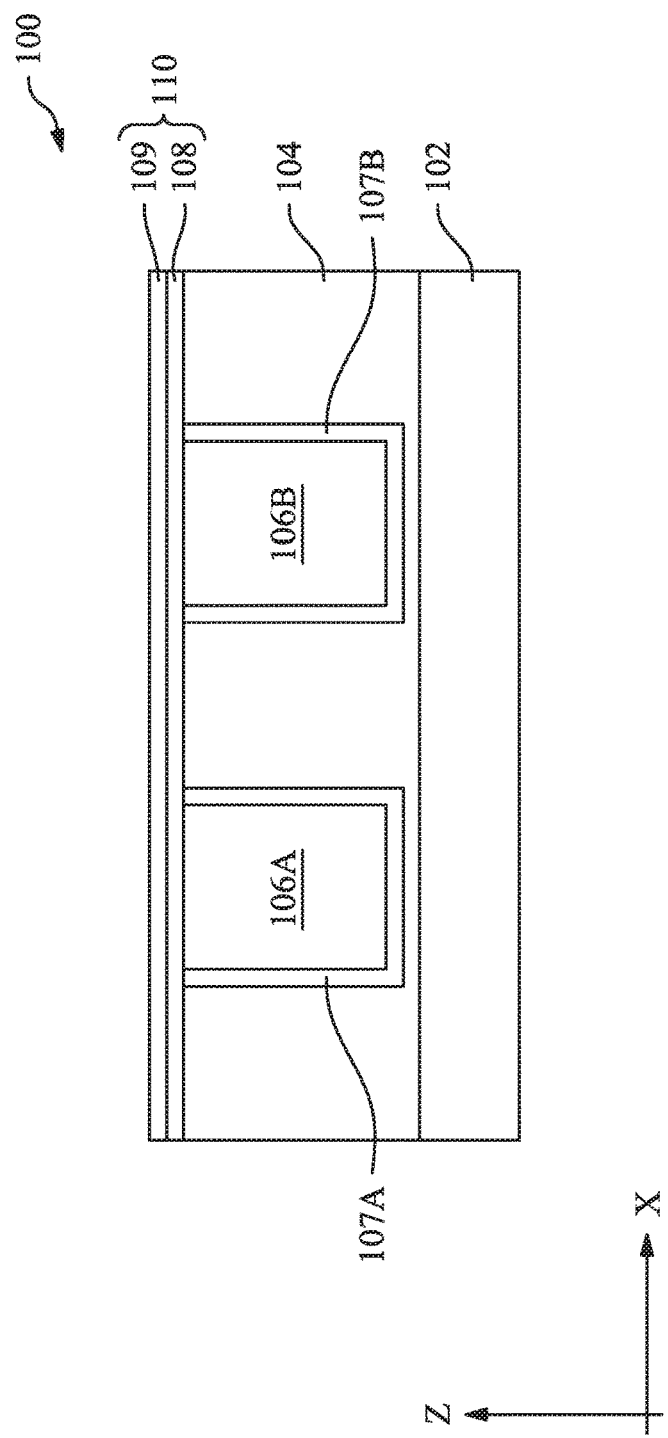

At operation 16, the method 10 (FIG. 1) forms a MCD layer 109 over the SCD layer 108. Referring to FIG. 9C, the MCD layer 109 may be formed as a conformal layer or a non-conformal layer in various embodiments. In an embodiment, the MCD layer 109 comprises an oxide of a metal material or a nitride of a metal material. In embodiments, the metal material may comprise aluminum (Al), tantalum (Ta), titanium (Ti), hafnium (Hf), or other metals. For example, the MCD layer 109 may comprise aluminum nitride, aluminum oxide, tantalum oxide, titanium oxide, hafnium oxide, other metal oxide compounds, or other metal nitride compounds. The MCD layer 109 is electrically insulating and has large etching selectivity with respect to a low-k dielectric material, such as the material in the dielectric layer 104. The MCD layer 109 may be deposited using PVD, CVD, PECVD, ALD, PEALD, plating (electro or electro-less), or other deposition techniques. In an embodiment, the MCD layer 109 is deposited in a chamber with a temperature ranging from room temperature to about 600 degrees Celsius and at a pressure ranging from 0 to 100 torr. The SCD layer 108 and the MCD layer 109 may be deposited in the same process chamber. The thickness of the MCD layer 109 may be controlled to achieve a balance in design needs. A thicker MCD layer 109 may provide a stronger etch-stop function, at the expense of increased package size. In embodiments, the MCD layer 109 is thinner than 500 Å. For example, the MCD layer 109 may be deposited to a thickness ranging from 5 Å to 100 Å. In the present embodiment, the new etch stop layer 110 includes the SCD layer 108 and the MCD layer 109. The etch stop layer 110 is generally thinner than traditional silicon-based etch stop layers because the MCD layer 109 can be made thinner while providing stronger etch-stop function.

Figure 9D:
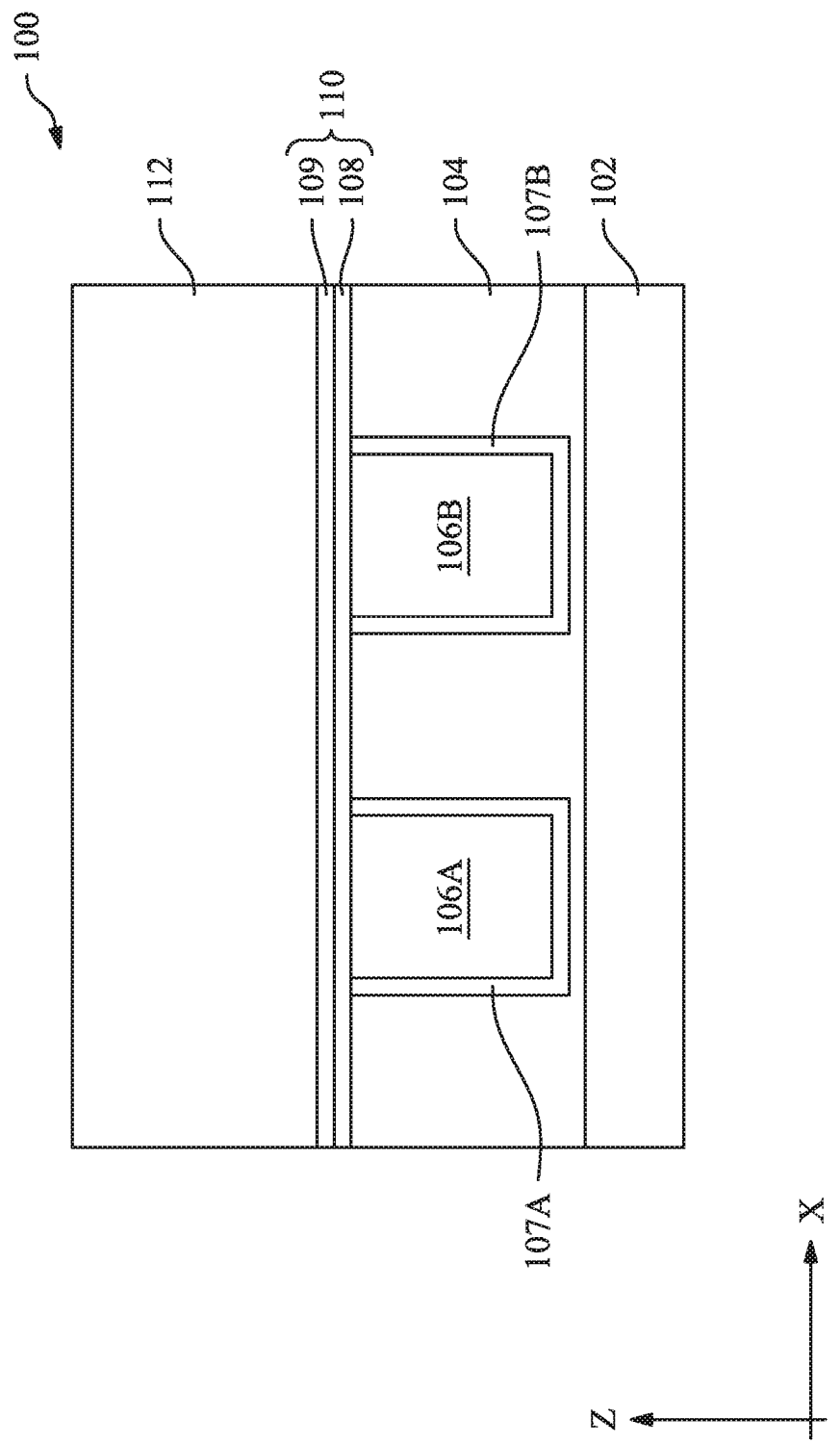

At operation 18, the method 10 (FIG. 1) forms another dielectric layer 112 over the etch stop layer 110. Referring to FIG. 9D, the dielectric layer 112 may comprise about the same material as the dielectric layer 104 discussed above. The dielectric layer 112 may be deposited using PVD, CVD, LPCVD, PECVD, FCVD, or other suitable deposition techniques. A metal interconnect layer will be formed in the dielectric layer 112. An appropriate thickness of the dielectric layer 112 may be selected based on the semiconductor package and metal layer design requirements.

Figure 9E:
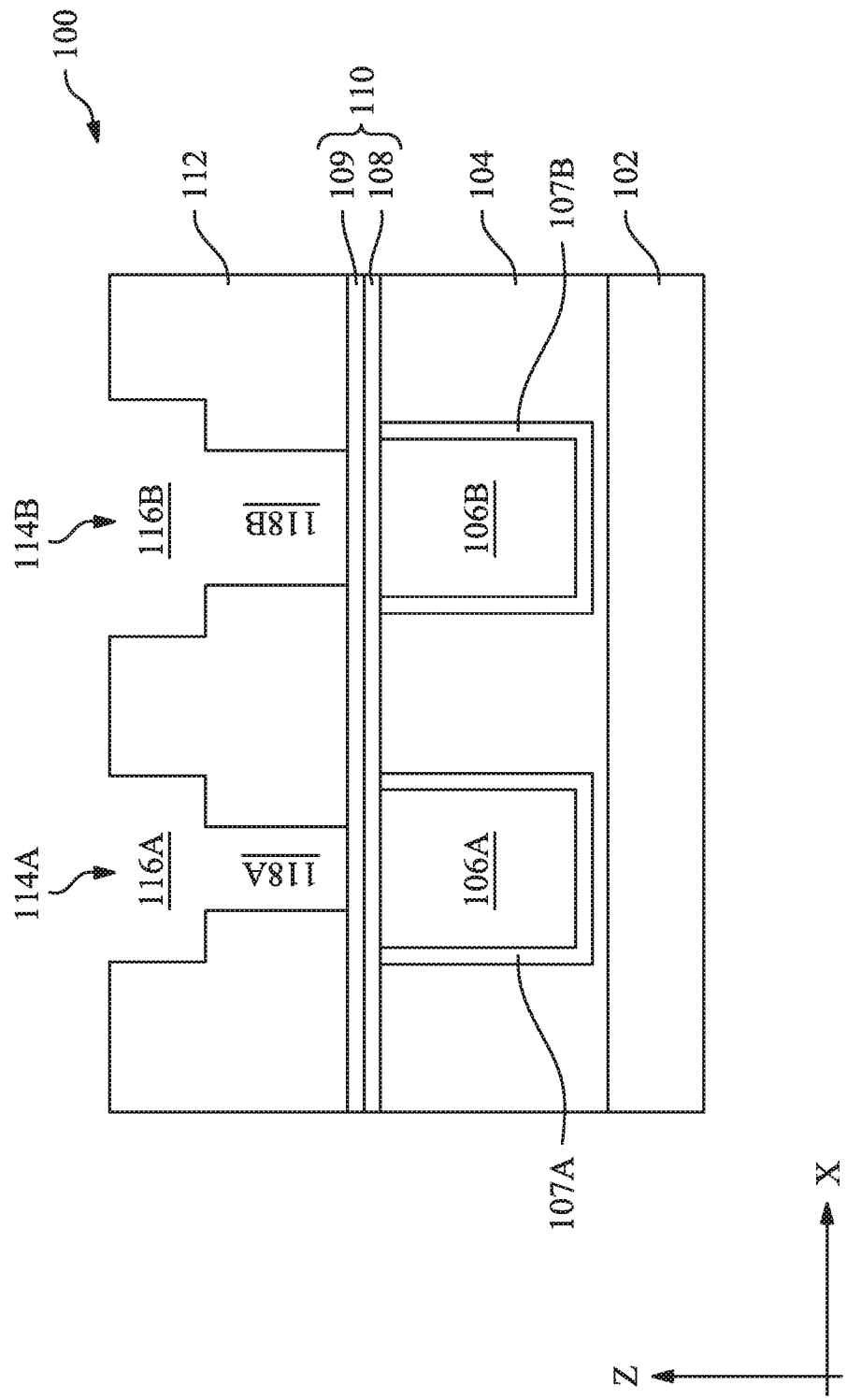

At operation 20, the method 10 (FIG. 1) etches the dielectric layer 112 to form trenches 114A and 114B therein. Referring to FIG. 9E, the trenches 114A and 114B expose the MCD layer 109. The trench 114A includes a top portion 116A and a bottom portion 118A, where the top portion 116A is a placeholder for a line conductor and the bottom portion 118A is a placeholder for a via (or a plug). Similarly, the trench 114B includes a top portion 116B and a bottom portion 118B. In embodiments, operation 20 may use a single damascene or a dual damascene process, and may use a via-first approach or a line-first approach.

Operation 20 may include one or more photolithography processes and one or more etching processes. For example, the photolithography process may include forming a photoresist (or resist) layer overlying the dielectric layer 112, exposing the resist to a pattern, performing post-exposure bake processes, and developing the resist to form a masking element including the resist. The masking element is then used for etching trenches into the dielectric layer 112. In an embodiment, one or more patterning layers, such as a hard mask layer and/or an anti-reflective coating layer, may be deposited between the dielectric layer 112 and the resist layer before the resist layer is patterned. To further this embodiment, the pattern is transferred from the resist layer to the one or more patterning layers, and then to the dielectric layer 112. Furthermore, multiple patterning techniques may be used to achieve small critical dimension (CD) in the trenches 114A and 114B.

The etching of the dielectric layer 112 may use dry etching, wet etching, and/or other suitable processes as discussed above. The etching process is selectively tuned to remove the material(s) of the dielectric layer 112 but not the material(s) of the MCD layer 109. Due to various factors such as uneven via pattern distribution, variations in CDs, and high aspect ratios of via trenches, some via trenches may reach the MCD layer 109 earlier than other via trenches. For illustration purposes, FIG. 9E shows that the trench 118A has a smaller CD and a higher aspect ratio than the trench 118B. In many cases, it is more likely that the etching of the trench 118B exposes the MCD layer 109 earlier than the etching of the trench 118A does because more etchants reach into the trench 118B and react with the dielectric material therein. The etching rate also depends on whether the trenches 118A and 118B are in an isolated via area or a dense via area on the substrate 102. However, it suffices to say that not all via trenches are etched at the same rate. When one via (e.g., trench 118B) has reached the MCD layer 109 while another via (e.g., trench 118A) has not, continuous etching is performed to ensure all via trenches reach the MCD layer 109. Otherwise, under-etched via trenches would lead to open circuit defects. With traditional silicon-based etch stop layers, the continuous etching might over-etch and penetrate the silicon-based etch stop layer, and damage the features underneath. In the present embodiment, the MCD layer 109 has large etching selectivity with respect to the dielectric layer 112 and can therefore withstand the continuous etching operation. In the present embodiment, all via trenches reach, and stop at, the MCD layer 109 during operation 20.

Figure 9F:
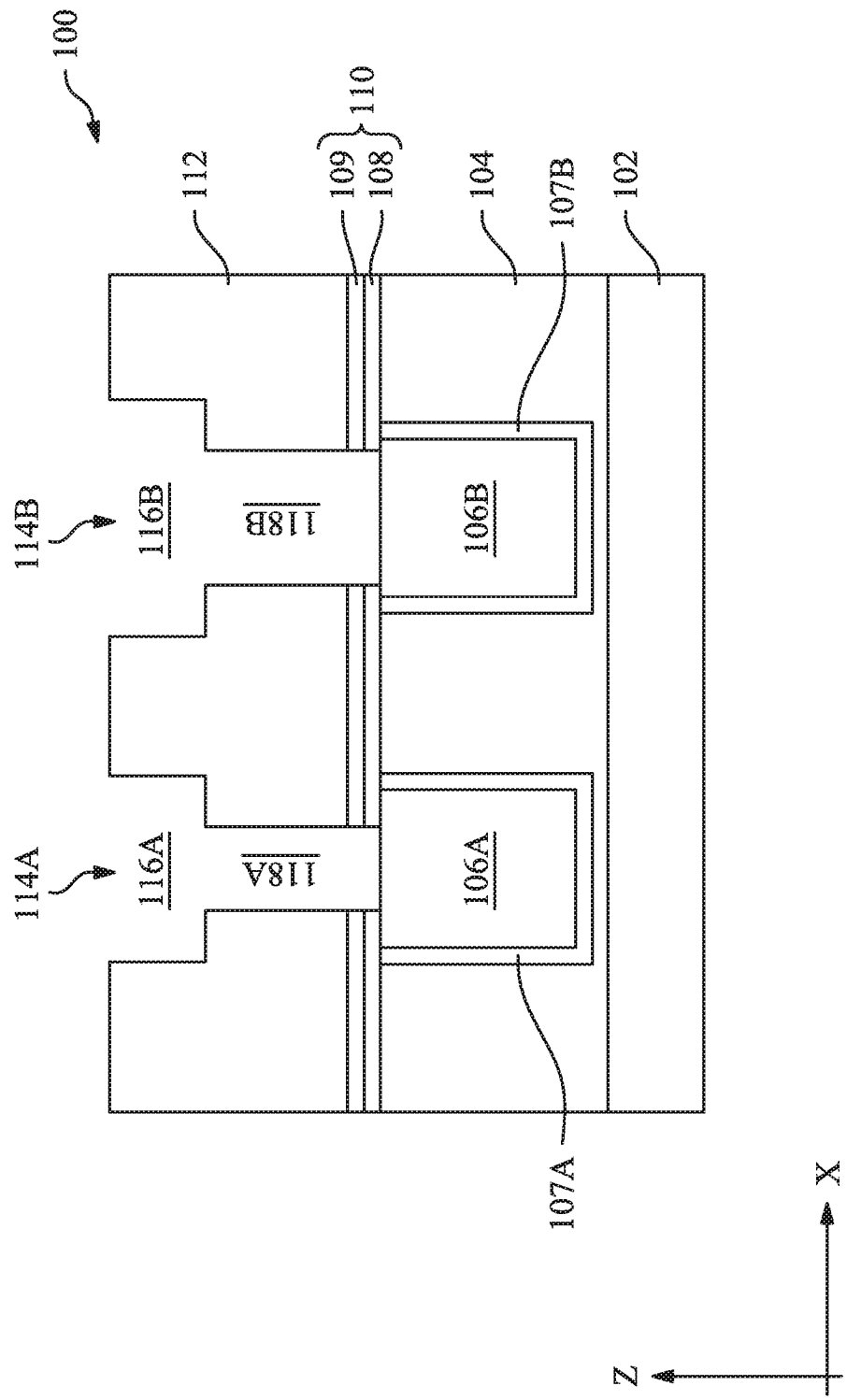

At operation 22, the method 10 (FIG. 1) etches and opens the etch stop layer 110 including the MCD layer 109 and the SCD layer 108. Referring to FIGS. 9E and 9F, the MCD layer 109 and the SCD layer 108 are etched and removed within the trenches 118A and 118B. As a result, the conductive features 106A and 106B are exposed in the trenches 118A and 118B respectively. Operation 22 may include one or more dry etching, wet etching, or other suitable etching techniques that are selectively tuned to remove the materials of the etch stop layer 110 while the dielectric layer 112 remains substantially unchanged. In an embodiment, operation 22 includes one or more anisotropic etching processes. A cleaning process may be performed to remove residues from the exposed portions of the conductive features 106A and 106B.

Figure 9G:
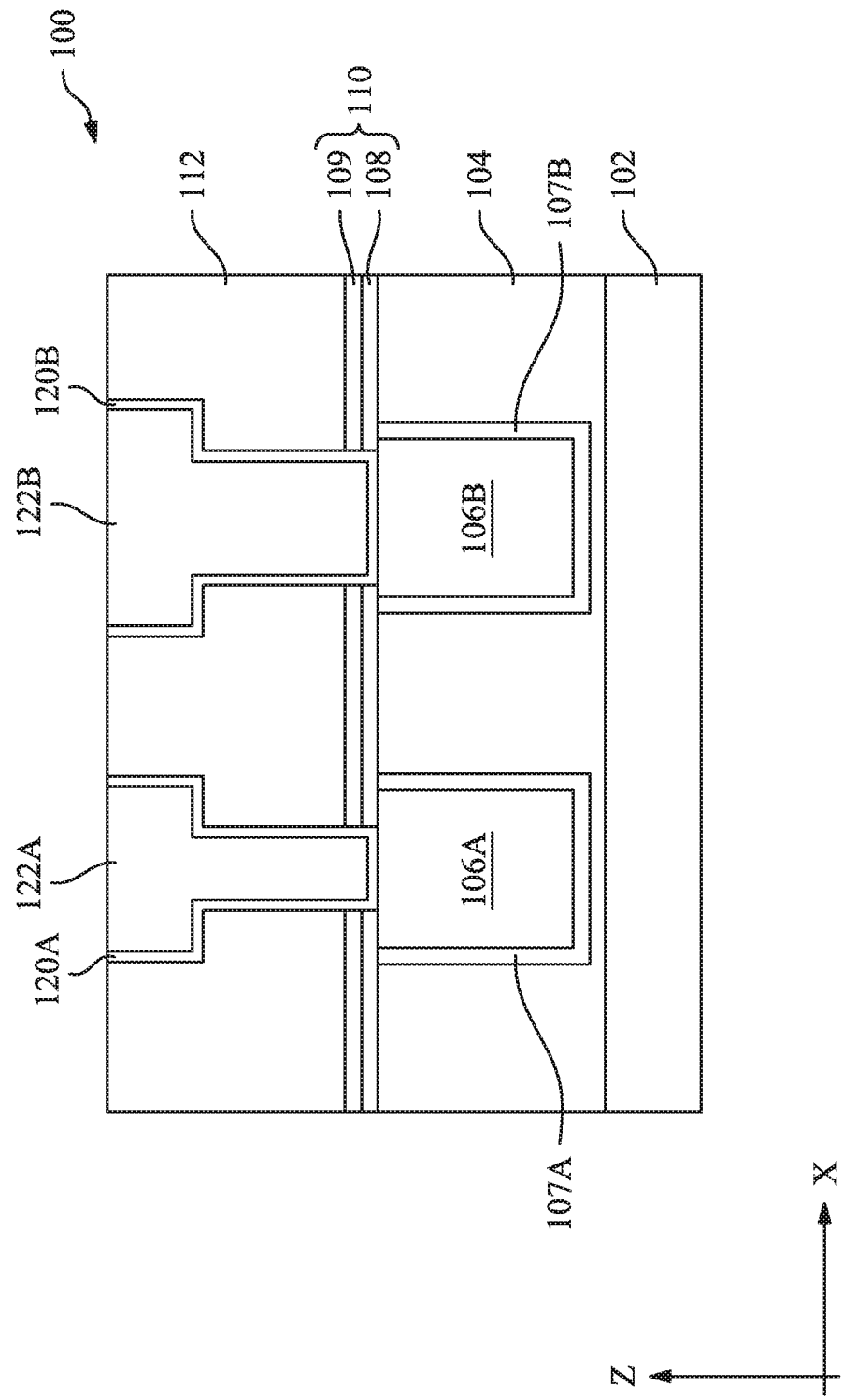

At operation 24, the method 10 (FIG. 1) forms barrier layers 120A and 120B and conductive features 122A and 122B in the trenches 114A and 114B respectively. FIG. 9G shows a result of operation 24 using a dual damascene process. Referring to FIG. 9G, the barrier layers 120A and 120B are formed as a liner layer on sidewalls of the trenches 114A and 114B, and the conductive features 122A and 122B are formed in the trenches 114A and 114B over the barrier layers 120A and 120B, respectively. In an embodiment, the barrier layers 120A and 120B may comprise about the same material(s) as the barrier layers 107A and 107B; and the conductive features 122A and 122B may comprise about the same material(s) as the conductive features 106A and 106B. The conductive features 122A and 122B are electrically coupled to the conductive features 106A and 106B respectively. The connection between them may be direct contact or through the barrier layers 120A and 120B. The barrier layers 120A and 120B may be deposited using PVD, CVD, ALD, or other deposition techniques. The conductive features 122A and 122B may be formed by sputtering, CVD, or plating (electro or electro-less) techniques. A CMP process may be performed to planarize the top surface of the device 100 and to remove excessive barrier and conductive materials on the dielectric layer 112.

Still referring to FIG. 9G, in this fabrication stage, the device 100 comprises the substrate 102, the dielectric layer 104 over the substrate, and the conductive features 106A and 106B in the dielectric layer 104. The device 100 further comprises the new and improved etch stop layer 110 that includes the SCD layer 108 and the MCD layer 109 over the SCD layer 108. The device 100 further comprises the dielectric layer 112 over the etch stop layer 110 and the conductive features 122A and 122B in the dielectric layer 112. The conductive features 122A and 122B penetrate the etch stop layer 110 and electrically connect to the conductive features 106A and 106B respectively. The method 10 may repeat operations 14, 16, 18, 20, 22, and 24 to form more interconnect structures over the dielectric layer 112.

Third Embodiment

The third embodiment of the method 10 is described below with reference to FIGS. 1, 10, and 11A-11G in forming the device 200.

FIG. 10 shows a method 30 of forming the semiconductor device 200, wherein an air gap is formed between the conductive features 106A and 106B and wherein the etch stop layer 110 acts as bottom and side walls of the air gap. The method 30, considered an embodiment of the method 10, is briefly discussed below.

At operation 12, the method 30 (FIG. 10) provides a precursor of the semiconductor device 200, substantially the same as the device 100 in FIG. 9A. The method 30 proceeds from operation 12 to operation 32.

At operation 32, the method 30 (FIG. 10) etches a trench 130 in the dielectric layer 104 near one of the conductive features 106A and 106B. For the convenience of discussion, the trench 130 is etched between the conductive features 106A and 106B as shown in FIG. 11A. The trench 130 is a placeholder for an air gap to be formed. The depth, width, and length of the trench 130 may be selected based on design requirements. Since the substance with the lowest dielectric constant is air (k=1.0), an air gap will further reduce the parasitic capacitance of the interconnect structures. In embodiments, operation 32 may include a dry etching process, a wet etching process, or other etching techniques.

Figure 11B:
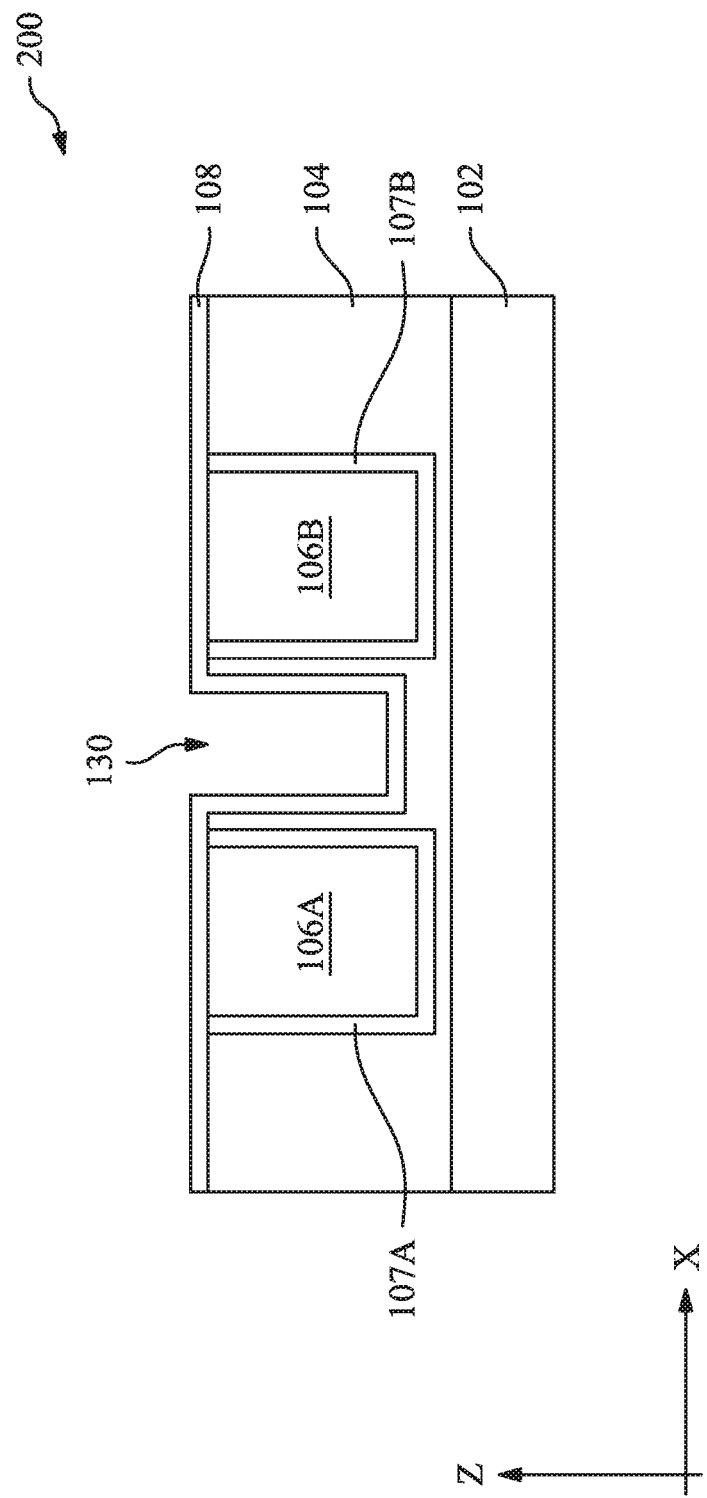
Figure 12:
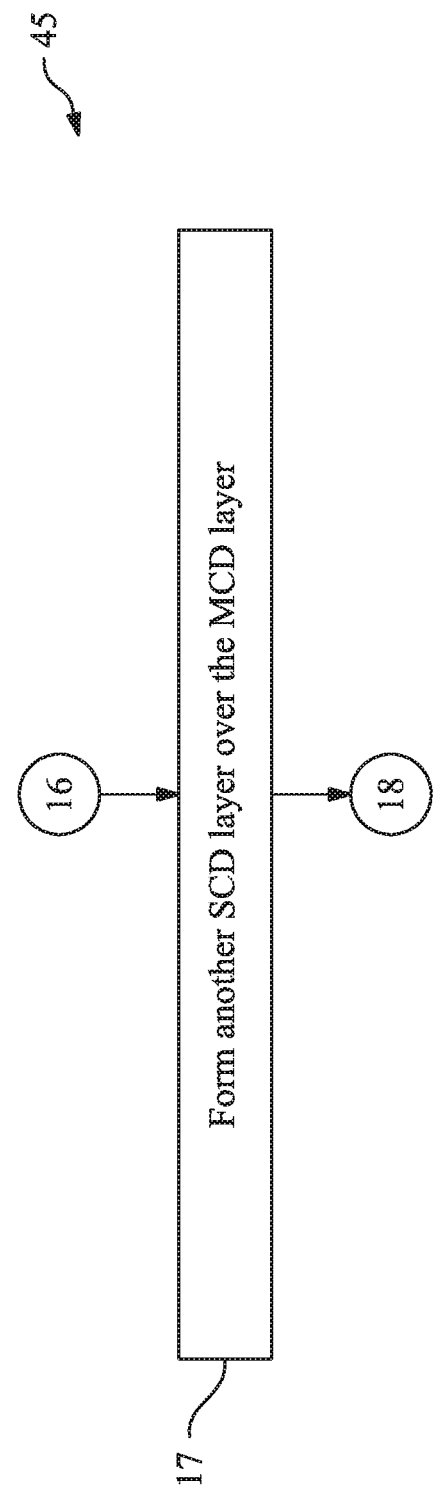
FIG. 12 is a flow chart of another embodiment of the method in FIG. 1.

At operation 34, the method 30 (FIG. 10) forms the SCD layer 108 over the dielectric layer 104 and in the trench 130 (FIG. 11B). Operation 34 is an embodiment of operation 14 of FIG. 1. Therefore, many details of operation 34 are omitted for brevity. The SCD layer 108 is formed on bottom and side walls of the trench 130, but does not completely fill the trench 130.

Figure 11C:
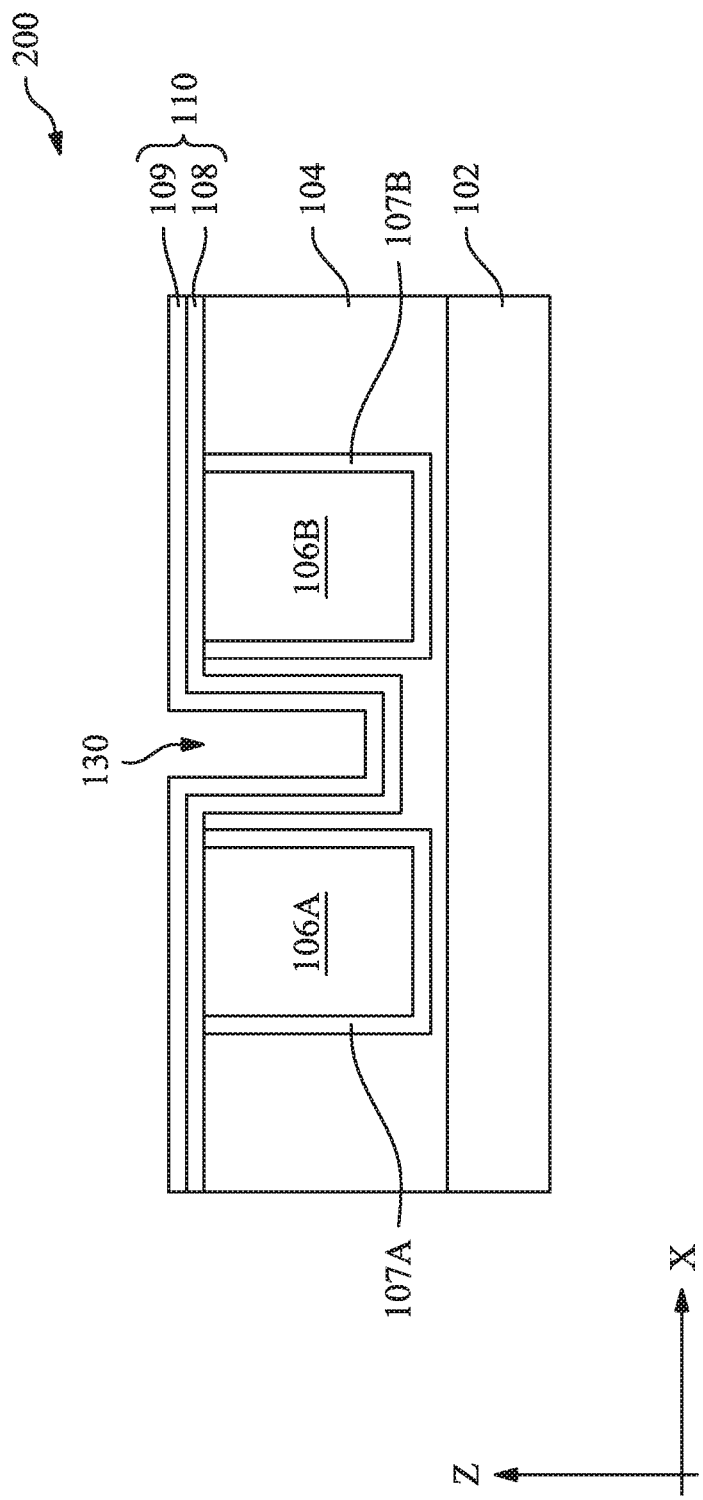

At operation 36, the method 30 (FIG. 10) forms the MCD layer 109 over the SCD layer 108 and in the trench 130 (FIG. 11C). Operation 36 is an embodiment of operation 16 of FIG. 1. Therefore, many details of operation 36 are omitted for brevity. As shown in FIG. 11C, the etch stop layer 110 includes the SCD layer 108 and the MCD layer 109. The etch stop layer 110 is disposed on bottom and side walls of the trench 130, but does not completely fill the trench 130. In an embodiment, either or both of the SCD layer 108 and the MCD layer 109 are formed to be a conformal layer (i.e., having a substantially constant thickness). In an alternative embodiment, neither of the SCD layer 108 and the MCD layer 109 is conformal (i.e., its thickness varies).

Figure 11D:
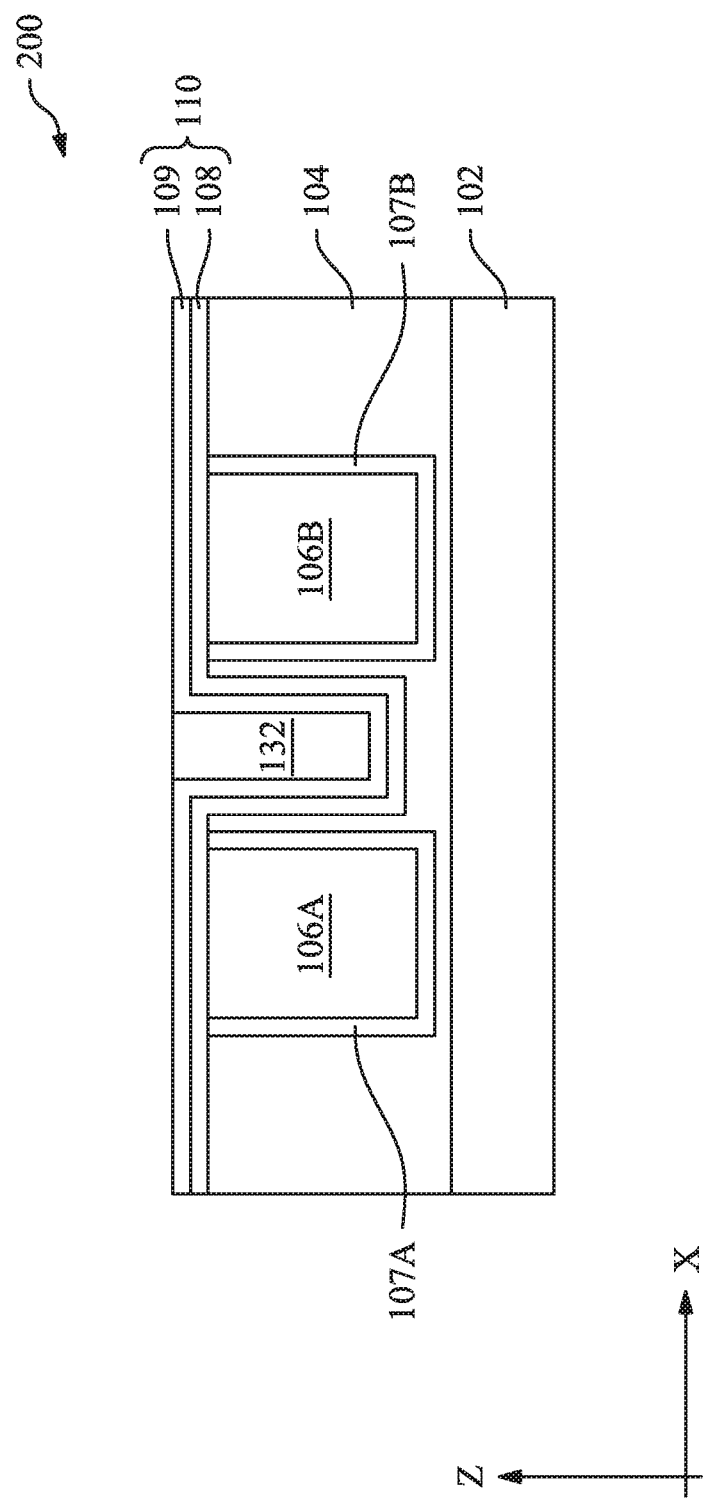

At operation 38, the method 30 (FIG. 10) deposits a decomposable layer 132 in the trench 130. Referring to FIG. 11D, the decomposable layer 132 fills the remaining portion of the trench 130. In some embodiments, the decomposable layer 132 includes a polymer that may decompose and vaporize when exposed to ultra-violet (UV) light and/or heated to an elevated temperature. For example, the decomposable layer 132 may comprise P (neopentul methacrylate-co-ethylene glycol dimethacrylate) copolymer, polypropylene glycol (PPG), polybutadine (PB), polyethylene glycol (PEG), polycaprolactone diol (PCL), or other suitable material. The decomposable layer 132 may be formed by spin coating, CVD, PECVD, ALD, PEALD, or other deposition techniques. An anisotropic etching process may be performed to remove excessive materials of the decomposable layer 132 from the top surface of the MCD layer 109, keeping the decomposable layer 132 in the trench 130 only (FIG. 11C).

Figure 11E:
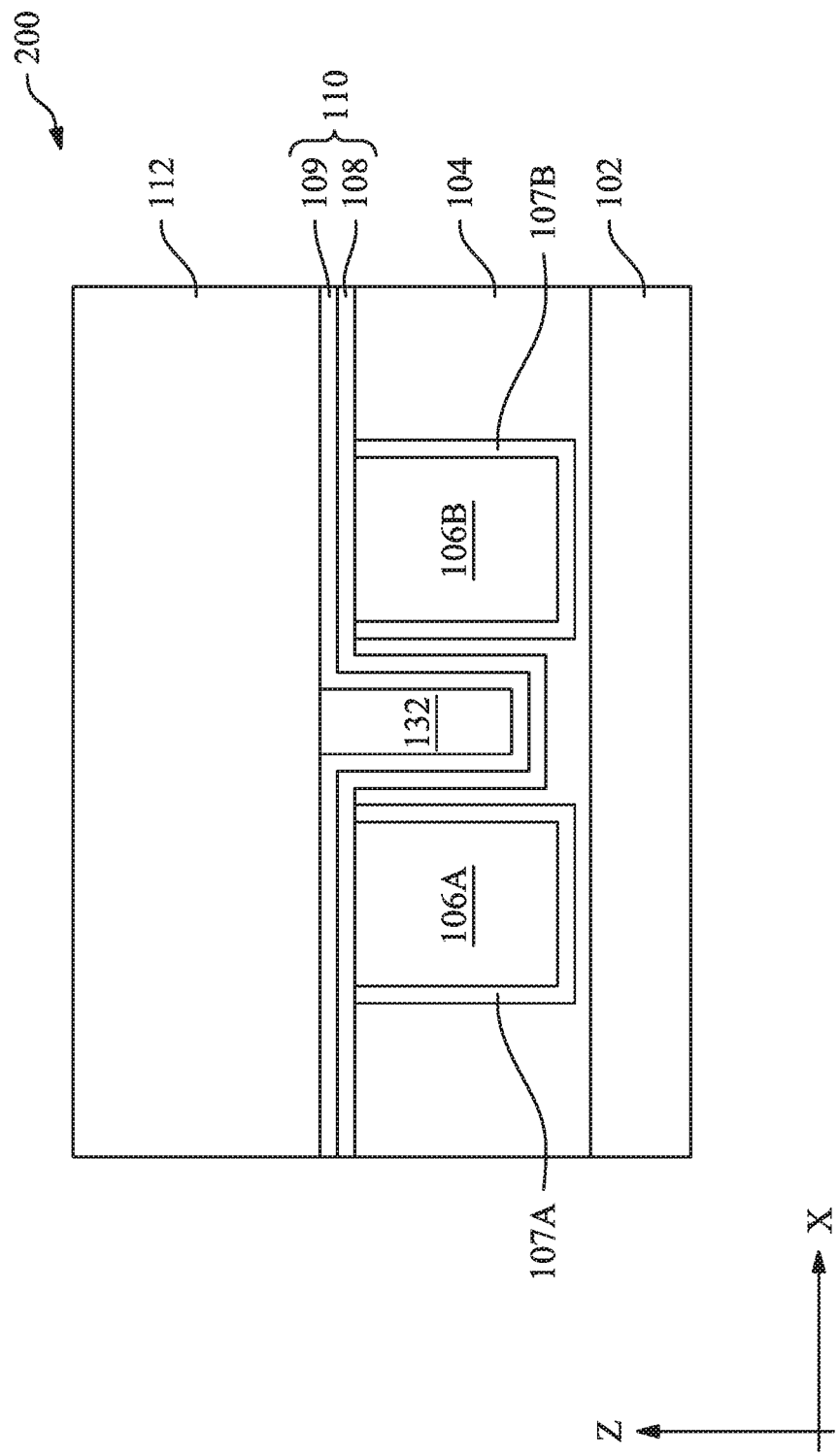

At operation 40, the method 30 (FIG. 10) forms the dielectric layer 112 over the MCD layer 109 and the decomposable layer 132 (FIG. 11E). Operation 40 is an embodiment of operation 18 of FIG. 1. Therefore, many details of operation 40 are omitted for brevity.

Figure 11F:
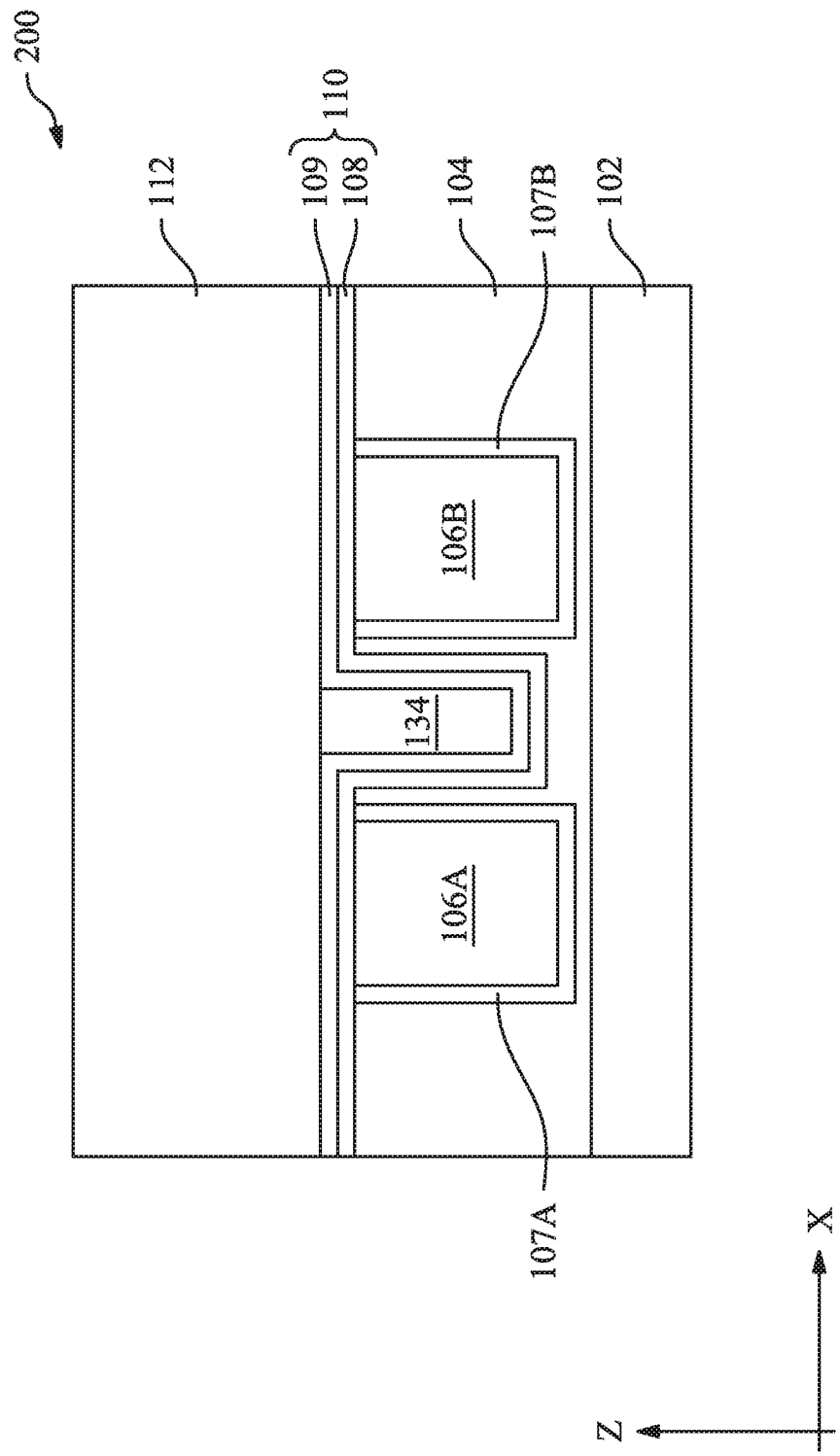

At operation 42, the method 30 (FIG. 10) removes the decomposable layer 132 to form an air gap 134 (FIG. 11F). In an embodiment, operation 42 includes exposing the device 200 to UV lights or heating the device 200 to an elevated temperature such that the decomposable layer 132 decomposes and turns into a vapor. The vapor molecules are small enough to diffuse through the pores of the dielectric layer 112. Referring to FIG. 11F, the air gap 134 is surrounded by the MCD layer 109 at its bottom and side walls, and by the dielectric layer 112 at its ceiling. Since the etch stop layer 110 may be made thinner than traditional silicon-based etch stop layers, the air gap 134 may be made larger than traditional air gaps given the limited space between the conductive features 106A and 106B. This advantageously reduces parasitic capacitance in the interconnect structures.

Figure 11G:
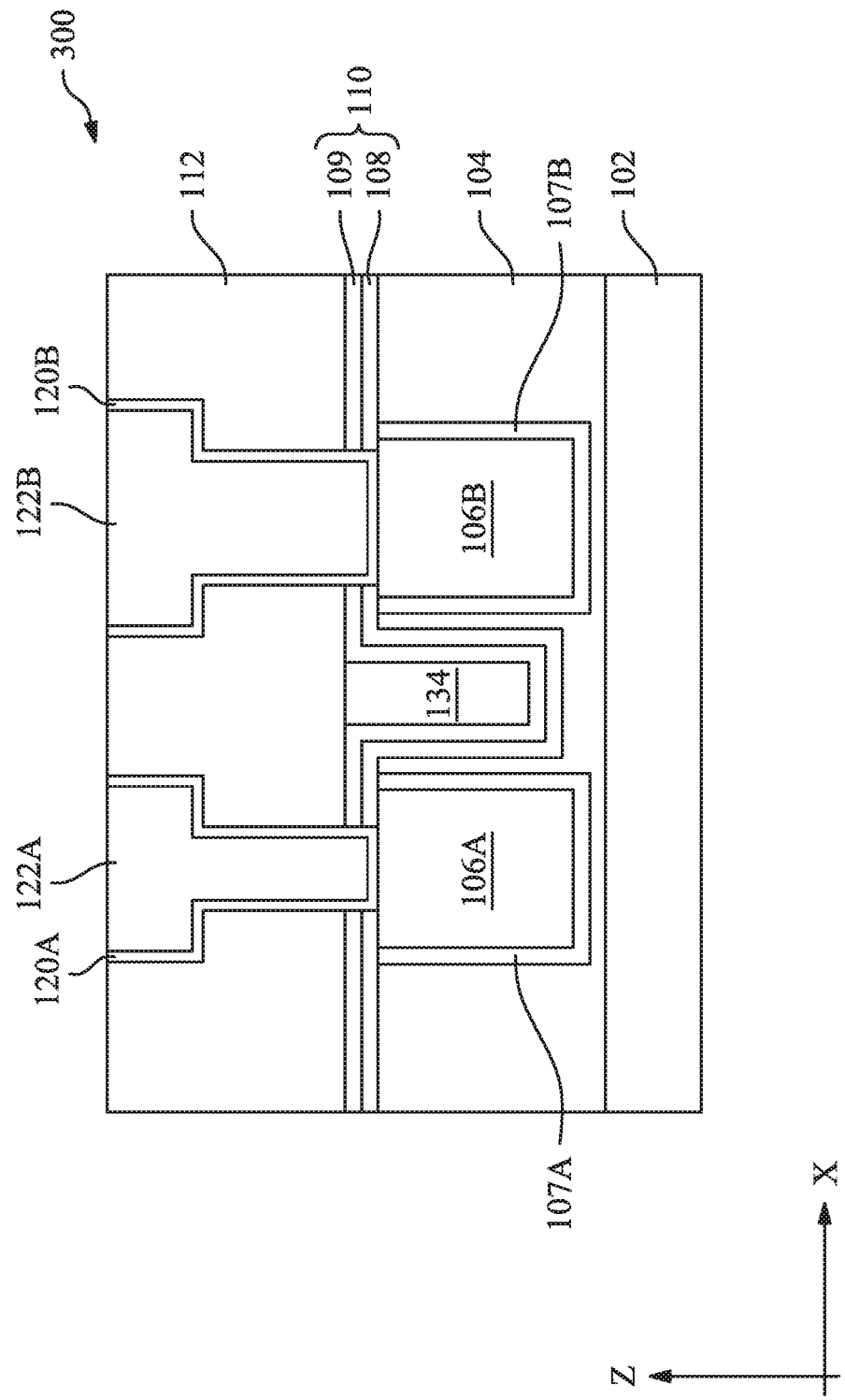

The method 30 (FIG. 10) proceeds to operation 20 (FIG. 1) to continue manufacturing the device 200, as discussed above with respect to the device 100. FIG. 11G shows the device 200 after operations 20, 22, and 24 have been performed. Referring to FIG. 11G, the device 200 comprises substantially the same elements as the device 100 (FIG. 9G) with the addition of the air gap 134 between the conductive features 106A and 106B, where the etch stop layer 110 acts as bottom and side walls of the air gap 134.

Fourth Embodiment

The fourth embodiment of the method 10 is described below with reference to FIGS. 1, 12, and 13A-13C in forming the device 300. FIG. 12 shows a method 45 of forming the semiconductor device 300, wherein the etch stop layer 110 includes the SCD layer 108, the MCD layer 109, and another SCD layer 111 (FIG. 13A) over the MCD layer 109. The method 45, considered an embodiment of the method 10, is briefly discussed below.

The method 45 (FIG. 12) receives a precursor of the device 300 in operation 12 (FIG. 1), forms the SCD layer 108 in operation 14 (FIG. 1), and forms the MCD layer 109 in operation 16 (FIG. 1). These operations are substantially the same as discussed above with respect to the device 100. The method 45 proceeds from operation 16 to operation 17 (FIG. 12).

Figure 13A:
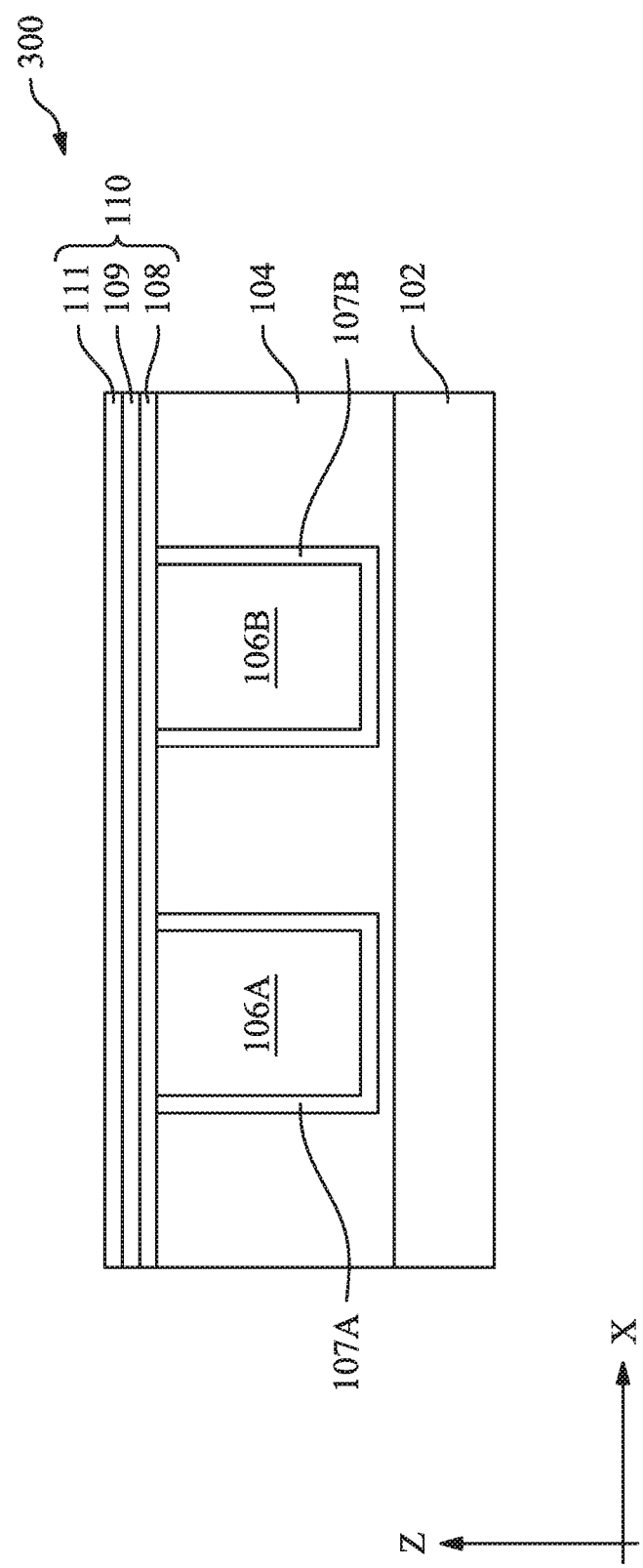
FIGS. 13A, 13B, and 13C are cross-sectional views of a portion of a semiconductor device in various fabrication stages according to the method in FIG. 12, in accordance with some embodiments.
Figure 13B:
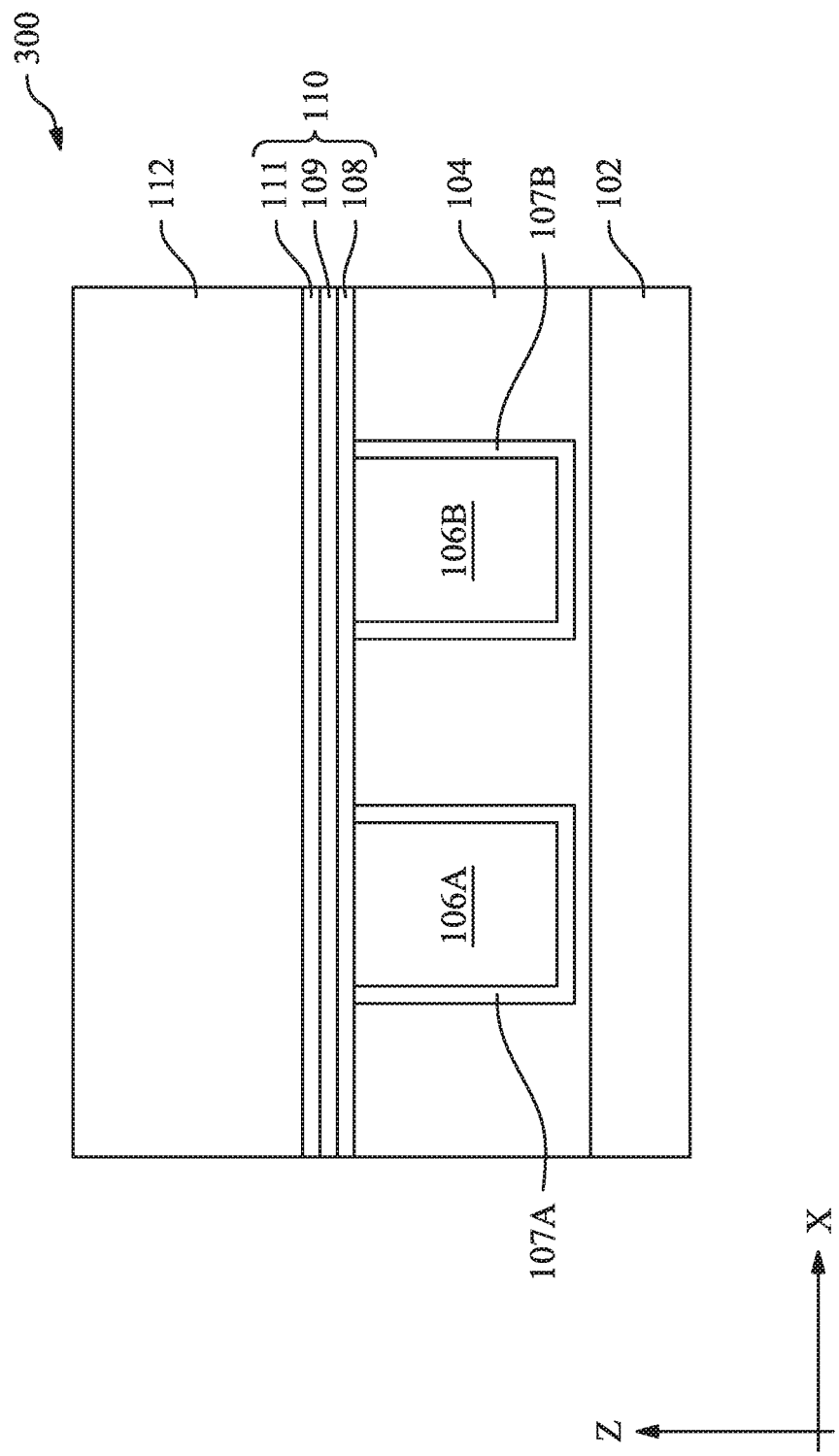

At operation 17, the method 45 (FIG. 12) forms the SCD layer 111 over the MCD layer 109. Referring to FIG. 13A, the etch stop layer 110 of this embodiment includes the two SCD layers 108 and 111, and the MCD layer 109 sandwiched between the two SCD layers. The SCD layer 111 may comprise one or more materials discussed above with respect to the SCD layer 108, and may be formed by PVD, CVD, PECVD, ALD, PEALD, or other deposition techniques. The SCD layers 108 and 111 may comprise same or different materials. The SCD layer 111 functions as a barrier layer and a hermetic layer for the dielectric layer 112 (FIG. 13B). In some embodiments, the SCD layer 111 is controlled to be thinner than 1000 Å. For example, the SCD layer 111 may be deposited to a thickness ranging from 5 Å to 300 Å.

Figure 13C:
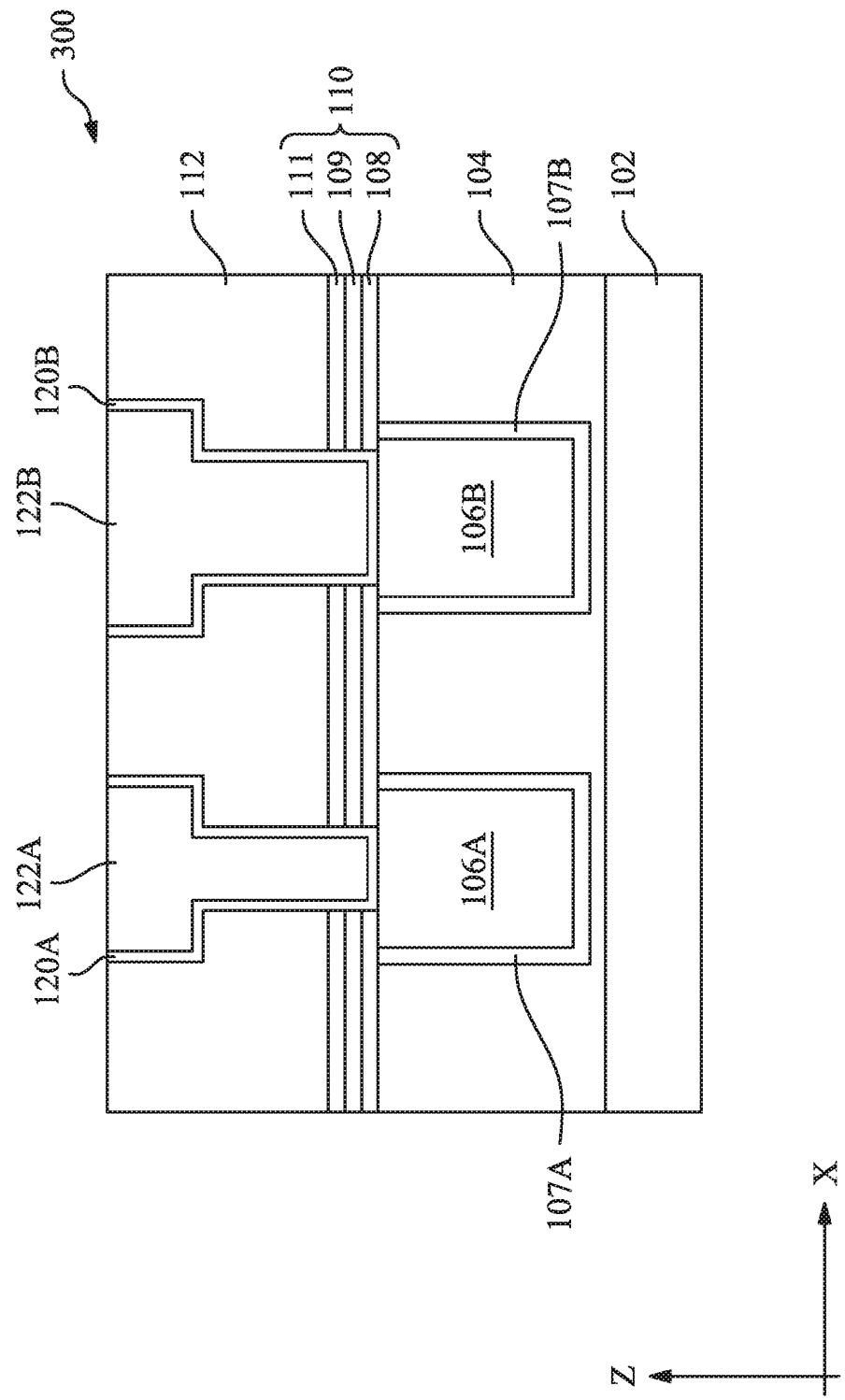

The method 45 (FIG. 12) proceeds from operation 17 to operation 18 to deposit the dielectric layer 112 over the etch stop layer 110 (FIG. 13B). Thereafter, the method 45 continues manufacturing the device 300, as discussed above with respect to the device 100. FIG. 13C shows the device 300 after operations 18, 20, 22, and 24 have been performed. Referring to FIG. 13C, the device 300 comprises substantially the same elements as the device 100 (FIG. 9G) with the addition of the SCD layer 111 over the MCD layer 109.

Although not intended to be limiting, one or more embodiments of the present disclosure provide many benefits to a semiconductor device and a formation process thereof. For example, embodiments of the present disclosure provide a new and improved etch stop layer for use in semiconductor manufacturing. The new etch stop layer provides greater etch selectivity with respect to commonly used low-k dielectric materials than traditional silicon-based etch stop layers. Therefore, the new etch stop layer can more effectively prevent interconnect trench over-etching and under-etching issues. Further, the new etch stop layer can be made thinner than traditional silicon-based etch stop layers, leading to reduced package sizes. Furthermore, the new etch stop layer enables larger air gaps to be formed in interconnect structures.

In one exemplary aspect, the present disclosure is directed to a semiconductor device. The semiconductor device includes a substrate, a first conductive feature over a portion of the substrate, and an etch stop layer over the substrate and the first conductive feature. The etch stop layer includes a silicon-containing dielectric (SCD) layer and a metal-containing dielectric (MCD) layer over the SCD layer. The semiconductor device further includes a dielectric layer over the etch stop layer, and a second conductive feature in the dielectric layer. The second conductive feature penetrates the etch stop layer and electrically connects to the first conductive feature. In an embodiment, the first conductive feature is a source or drain (S/D) feature. In another embodiment, the first conductive feature is a gate structure. In yet another embodiment, the first conductive feature is an interconnect wire feature. In an embodiment, the semiconductor device further includes another dielectric layer over the substrate and under the etch stop layer, wherein the first conductive feature is embedded in the another dielectric layer.

In another exemplary aspect, the present disclosure is directed to a semiconductor device. The semiconductor device includes a substrate, a first low-k dielectric layer over the substrate, a first conductive feature in the first low-k dielectric layer, and an etch stop layer over the first low-k dielectric layer. The etch stop layer includes a silicon-containing dielectric (SCD) layer and a metal-containing dielectric (MCD) layer over the SCD layer, wherein the MCD layer comprises an oxide of a metal material or a nitride of the metal material. The semiconductor device further includes a second low-k dielectric layer over the etch stop layer and a second conductive feature partially in the second low-k dielectric layer. The second conductive feature penetrates the etch stop layer and electrically connects to the first conductive feature.

In yet another exemplary aspect, the present disclosure is directed to a method. The method includes providing a precursor having a substrate, a first dielectric layer over the substrate, and a first conductive feature in the first dielectric layer. The method further includes forming a silicon-containing dielectric (SCD) layer over the first dielectric layer, forming a metal-containing dielectric (MCD) layer over the SCD layer, forming a second dielectric layer over the MCD layer, and etching the second dielectric layer to form a trench, the trench exposing the MCD layer.

The foregoing outlines features of several embodiments so that those of ordinary skill in the art may better understand the aspects of the present disclosure. Those of ordinary skill in the art should appreciate that they may readily use the present disclosure as a basis for designing or modifying other processes and structures for carrying out the same purposes and/or achieving the same advantages of the embodiments introduced herein. Those of ordinary skill in the art should also realize that such equivalent constructions do not depart from the spirit and scope of the present disclosure, and that they may make various changes, substitutions, and alterations herein without departing from the spirit and scope of the present disclosure.

What is claimed is:

1. A method comprising:
   receiving a substrate having a source/drain feature disposed thereon, the source/drain feature including a topmost surface facing away from the substrate, wherein the receiving of the substrate having the source/drain feature disposed thereon includes the substrate having a fin structure and the source/drain feature at least partially embedded in the fin structure;
   forming an etch stop layer on the substrate and the source/drain feature, wherein the forming of the etch stop layer includes:
      forming a first layer having a first composition on the substrate and the source/drain feature such that the first layer physically contacts the topmost surface of the source/drain feature; and
      forming a second layer having a second composition that is different from the first composition on the first layer;
   etching a portion of the etch stop layer to define a trench within the etch stop layer, wherein a first portion of the topmost surface of the source/drain feature remains covered by a portion of the first layer while a second portion of the topmost surface of the source/drain feature is exposed after the etching of the portion of the etch stop layer to define the trench; and
   forming a conductive feature within the trench that extends through the etch stop layer.

2. The method of claim 1, wherein the first layer includes a semiconductor-containing dielectric.

3. The method of claim 2, wherein the second layer includes a metal-containing dielectric.

4. The method of claim 1, wherein the substrate has a gate structure disposed on the substrate, and the forming of the etch stop layer forms the etch stop layer on the gate structure.

5. The method of claim 4, wherein the forming of the etch stop layer forms the etch stop layer on a top surface of the gate structure and on a side surface of the gate structure.

6. The method of claim 1, wherein the first layer physically contacts the second layer.

7. The method of claim 1, wherein the first layer includes carbon and nitrogen.

8. The method of claim 1, wherein the first layer includes silicon and the second layer includes a metal nitride.

9. A method comprising:
   receiving a substrate;
   forming a semiconductor fin structure on the substrate, the semiconductor fin structure having a top surface facing away from the substrate;
   forming a source/drain feature disposed on and interfacing with the top surface of the semiconductor fin structure;
   forming an etch stop layer on the substrate that includes a semiconductor-containing dielectric layer and a metal-containing dielectric layer disposed on the semiconductor-containing dielectric layer, wherein the semiconductor-containing dielectric layer includes silicon, nitrogen and carbon, wherein the forming of the etch stop layer on the substrate includes forming the etch stop layer on the source/drain feature such that the semiconductor-containing dielectric layer interfaces with a side surface and a top surface of the source/drain feature, the top surface of the source/drain feature facing away from the substrate;
   removing a first portion of the semiconductor-containing dielectric layer to expose a first portion of the top surface of the source/drain feature while a second portion of the top surface of the source/drain feature remains covered by a second portion of the semiconductor-containing dielectric layer; and
   forming a conductive feature on the exposed first portion of the top surface of the source/drain feature while the second portion of the top surface of the source/drain feature remains covered by the second portion of the first layer.

10. The method of claim 9, wherein:
    the substrate has a gate feature disposed on the substrate;
    the forming of the etch stop layer forms the etch stop layer on the gate feature; and
    the conductive feature extends through the etch stop layer to physically couple to the gate feature.

11. The method of claim 10, wherein the forming of the etch stop layer forms the etch stop layer on a top surface of the gate feature and on opposing side surfaces of the gate feature.

12. The method of claim 9, wherein the forming of the etch stop layer on the substrate includes forming the metal-containing dielectric layer directly on the semiconductor-containing dielectric layer.

13. The method of claim 12, further comprising:
    forming an interlayer dielectric layer directly on the metal-containing dielectric layer; and
    forming a trench through the interlayer dielectric layer to expose a first portion of the metal-containing dielectric layer, and
    wherein the removing of the first portion of the semiconductor-containing dielectric layer to expose the first portion of the top surface of the source/drain feature further includes removing the first portion of the metal-containing dielectric layer.

14. A method comprising:
    forming a fin structure over a substrate, the fin structure having a first sidewall surface and an opposing second sidewall surface and a top surface extending from the first sidewall surface to the second sidewall surface;

forming a source/drain feature directly on the top surface of the fin structure, wherein the source/drain feature has a topmost surface facing away from the substrate;

forming a first etch stop layer on the source/drain feature and the fin structure such that the first etch stop layer physically contacts a side surface of the source/drain feature, the first sidewall surface of the fin structure and the second sidewall surface of the fin structure, wherein the forming of the first etch stop layer on the source/drain feature includes forming the first etch stop layer directly on the topmost surface of the source/drain feature;

forming a second etch stop layer disposed on the first etch stop layer over the source/drain feature, wherein the second etch stop layer is different in composition from the first etch stop layer;

removing a first portion of the first etch stop layer to expose a first portion of the topmost surface of the source/drain feature while a second portion of the topmost surface of the source/drain feature remains covered by a second portion of the first etch stop layer; and forming a conductive feature on the exposed first portion of the topmost surface of the source/drain feature while the second portion of the topmost surface of the source/drain feature remains covered by the second portion of the first etch stop layer.

15. The method of claim 14, further comprising:
forming a dielectric layer on the second etch stop layer disposed over the source/drain feature; and
forming a first conductive feature extending through the dielectric layer, the second etch stop layer, and the first etch stop layer to couple to the source/drain feature.

16. The method of claim 14, wherein the first etch stop layer includes a silicon-containing dielectric (SCD) material, and the second etch stop layer includes a metal-containing dielectric (MCD) material.

17. The method of claim 16, wherein the SCD material includes silicon and one of: oxygen, carbon, and nitrogen.

18. The method of claim 14, wherein the first etch stop layer includes silicon, carbon and nitrogen.

19. The method of claim 14, wherein the source/drain feature is at least partially embedded in the fin structure after the forming of the source/drain feature directly on the top surface of the fin structure.

20. The method of claim 14, wherein the forming of the first etch stop layer on the source/drain feature and the fin structure includes depositing the first etch stop layer to a thickness ranging from about 5 Å to about 300 Å, and
wherein the forming of the second etch stop layer disposed on the first etch stop layer over the source/drain feature includes depositing the second etch stop layer to a thickness ranging from about 5 Å to about 100 Å.

* * * * *